United States Patent
Mirkarimi et al.

(10) Patent No.: US 12,266,545 B1
(45) Date of Patent: Apr. 1, 2025

(54) STRUCTURES AND METHODS FOR INTEGRATED COLD PLATE IN XPUS AND MEMORY

(71) Applicant: Adeia Semiconductor Bonding Technologies Inc., San Jose, CA (US)

(72) Inventors: Laura Mirkarimi, Sunol, CA (US); Gaius Gillman Fountain, Jr., Youngsville, NC (US); Belgacem Haba, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 0 days.

(21) Appl. No.: 18/892,142

(22) Filed: Sep. 20, 2024

Related U.S. Application Data

(60) Provisional application No. 63/689,428, filed on Aug. 30, 2024, provisional application No. 63/651,843, filed on May 24, 2024.

(51) Int. Cl.
*H01L 23/00* (2006.01)
*H01L 21/48* (2006.01)
(Continued)

(52) U.S. Cl.
CPC ........ *H01L 21/4882* (2013.01); *H01L 23/473* (2013.01); *H01L 25/0652* (2013.01);
(Continued)

(58) Field of Classification Search
CPC ............... H01L 21/4882; H01L 23/473; H01L 25/0652; H01L 25/18
See application file for complete search history.

(56) References Cited

U.S. PATENT DOCUMENTS

| | | |
|---|---|---|
| 4,274,479 A | 6/1981 | Eastman |
| 5,309,986 A | 5/1994 | Itoh |

(Continued)

FOREIGN PATENT DOCUMENTS

| | | |
|---|---|---|
| CN | 109524373 A | 3/2019 |
| CN | 111128976 A | 5/2020 |

(Continued)

OTHER PUBLICATIONS

"KoolMicro Inc. developed the World's First 2,000 W/cm2 Cooling Technology for High Heat Generation Chips," Press Release, 2 pages, downloaded from www.semiconductorpackagingnews.com/uploads/1/KoolMicro_High_Cooling_Power_Density.pdf on Nov. 22, 2023.

(Continued)

*Primary Examiner* — Thao P Le
(74) *Attorney, Agent, or Firm* — Haley Guiliano LLP

(57) ABSTRACT

A multi-component device package comprising an integrated cooling assembly and methods for manufacturing said multi-component device package. A multi-component device package may comprise a plurality of semiconductor devices encapsulated in a mold material. A portion of the mold material may be removed to expose the backside of at least one semiconductor device of the plurality of semiconductor devices. A first dielectric layer may be formed on the exposed backside of the at least one semiconductor device. A cold plate comprising a base plate may be prepared and then the base plate may be directly bonded to the exposed backside of the at least one semiconductor device.

19 Claims, 23 Drawing Sheets

(51) Int. Cl.
*H01L 23/473* (2006.01)
*H01L 25/00* (2006.01)
*H01L 25/065* (2023.01)
*H01L 25/18* (2023.01)
*H10B 80/00* (2023.01)

(52) U.S. Cl.
CPC .............. *H01L 25/18* (2013.01); *H01L 25/50* (2013.01); *H10B 80/00* (2023.02); *H01L 2225/06589* (2013.01)

(56) References Cited

U.S. PATENT DOCUMENTS

| | | | |
|---|---|---|---|
| 5,522,452 | A | 6/1996 | Mizuno et al. |
| 5,769,154 | A | 6/1998 | Adkins et al. |
| 6,056,044 | A | 5/2000 | Benson et al. |
| 6,351,384 | B1 | 2/2002 | Daikoku et al. |
| 6,686,532 | B1 | 2/2004 | MacRis |
| 6,822,326 | B2 | 11/2004 | Enquist et al. |
| 7,289,326 | B2 | 10/2007 | Heydari et al. |
| 7,485,957 | B2 | 2/2009 | Brandenburg et al. |
| 7,511,372 | B2 | 3/2009 | Chiu |
| 7,523,617 | B2 | 4/2009 | Venkatasubramanian et al. |
| 7,622,324 | B2 | 11/2009 | Enquist et al. |
| 7,692,926 | B2 | 4/2010 | Henderson et al. |
| 7,957,137 | B2 | 6/2011 | Prasher |
| 7,978,473 | B2 | 7/2011 | Campbell et al. |
| 7,997,087 | B2 | 8/2011 | Venkatasubramanian et al. |
| 8,164,169 | B2 | 4/2012 | Chrysler et al. |
| 8,630,091 | B2 | 1/2014 | Ward et al. |
| 9,224,673 | B2 | 12/2015 | Chen et al. |
| 9,299,641 | B2 | 3/2016 | Sekar et al. |
| 9,355,932 | B2 | 5/2016 | Ankireddi et al. |
| 9,391,143 | B2 | 7/2016 | Tong et al. |
| 9,553,071 | B1 | 1/2017 | Haba |
| 9,741,638 | B2 | 8/2017 | Hsieh et al. |
| 9,741,696 | B2 | 8/2017 | Katkar et al. |
| 9,746,248 | B2 | 8/2017 | Semenov et al. |
| 9,768,149 | B2 | 9/2017 | Vadhavkar et al. |
| 9,818,723 | B2 | 11/2017 | Haba |
| 10,032,695 | B2 | 7/2018 | Iyengar et al. |
| 10,083,934 | B2 | 9/2018 | Haba |
| 10,157,818 | B2 | 12/2018 | Chen et al. |
| 10,170,392 | B2 | 1/2019 | Chainer et al. |
| 10,199,356 | B2 | 2/2019 | Kinsley |
| 10,312,221 | B1 | 6/2019 | Agarwal et al. |
| 10,332,823 | B2 | 6/2019 | Chen et al. |
| 10,461,059 | B2 | 10/2019 | Koopmans et al. |
| 10,694,641 | B2 | 6/2020 | Basu et al. |
| 10,978,427 | B2 | 4/2021 | Li et al. |
| 11,187,469 | B2 | 11/2021 | Karesh |
| 11,387,164 | B2 | 7/2022 | Wu et al. |
| 11,598,594 | B2 | 3/2023 | Lewis et al. |
| 11,996,351 | B2 | 5/2024 | Hsiao et al. |
| 2003/0157782 | A1 | 8/2003 | Kellar et al. |
| 2004/0184237 | A1 | 9/2004 | Chang |
| 2004/0251530 | A1 | 12/2004 | Yamaji |
| 2005/0126766 | A1 | 6/2005 | Lee et al. |
| 2005/0213301 | A1 | 9/2005 | Prasher |
| 2006/0042825 | A1 | 3/2006 | Lu et al. |
| 2006/0103011 | A1 | 5/2006 | Andry et al. |
| 2007/0025082 | A1 | 2/2007 | Lee et al. |
| 2007/0107875 | A1 | 5/2007 | Lee et al. |
| 2008/0096320 | A1 | 4/2008 | Farrar |
| 2009/0122491 | A1 | 5/2009 | Martin et al. |
| 2010/0116534 | A1 | 5/2010 | Choi et al. |
| 2010/0230805 | A1 | 9/2010 | Refai-Ahmed |
| 2010/0300202 | A1 | 12/2010 | Joyce |
| 2011/0129986 | A1 | 6/2011 | Libralesso et al. |
| 2013/0044431 | A1 | 2/2013 | Koeneman |
| 2013/0050944 | A1 | 2/2013 | Shepard |
| 2013/0087904 | A1 | 4/2013 | Clark et al. |
| 2014/0126150 | A1 | 5/2014 | Song et al. |
| 2015/0194363 | A1 | 7/2015 | Jun et al. |
| 2016/0276314 | A1 | 9/2016 | Ching et al. |
| 2017/0012016 | A1 | 1/2017 | Joshi et al. |
| 2017/0092565 | A1 | 3/2017 | Chen et al. |
| 2017/0103937 | A1 | 4/2017 | Hsieh et al. |
| 2018/0053730 | A1 | 2/2018 | Shao et al. |
| 2018/0087842 | A1 | 3/2018 | Chainer et al. |
| 2018/0090427 | A1 | 3/2018 | Bernstein et al. |
| 2018/0160565 | A1 | 6/2018 | Parida |
| 2018/0211900 | A1 | 7/2018 | Gutala et al. |
| 2018/0308783 | A1 | 10/2018 | Refai-Ahmed et al. |
| 2019/0008071 | A1 | 1/2019 | Kim |
| 2019/0355706 | A1 | 11/2019 | Enquist et al. |
| 2019/0385928 | A1 | 12/2019 | Leobandung |
| 2020/0035583 | A1 | 1/2020 | Beauchemin et al. |
| 2020/0105639 | A1 | 4/2020 | Valavala et al. |
| 2020/0312742 | A1 | 10/2020 | Lofgreen et al. |
| 2020/0343160 | A1 | 10/2020 | Mizerak et al. |
| 2020/0350233 | A1 | 11/2020 | Mizerak et al. |
| 2020/0352053 | A1 | 11/2020 | Mizerak et al. |
| 2020/0395313 | A1 | 12/2020 | Mallik et al. |
| 2021/0013175 | A1* | 1/2021 | Osterwald ............... H01L 24/75 |
| 2021/0066164 | A1 | 3/2021 | Wu et al. |
| 2021/0175143 | A1 | 6/2021 | Yu et al. |
| 2021/0183741 | A1 | 6/2021 | Jha et al. |
| 2021/0193548 | A1 | 6/2021 | Wan et al. |
| 2021/0193620 | A1 | 6/2021 | Refai-Ahmed et al. |
| 2021/0280497 | A1 | 9/2021 | Brun et al. |
| 2021/0288037 | A1 | 9/2021 | Tao et al. |
| 2021/0378106 | A1 | 12/2021 | Iyengar et al. |
| 2021/0378139 | A1 | 12/2021 | Rice et al. |
| 2021/0410329 | A1 | 12/2021 | Yang et al. |
| 2022/0037231 | A1 | 2/2022 | Hsiao et al. |
| 2022/0087059 | A1 | 3/2022 | Sathyamurthy et al. |
| 2022/0117115 | A1 | 4/2022 | Malouin et al. |
| 2022/0130734 | A1 | 4/2022 | Chiu et al. |
| 2022/0189850 | A1 | 6/2022 | Liff et al. |
| 2022/0210949 | A1 | 6/2022 | Edmunds et al. |
| 2022/0230937 | A1 | 7/2022 | Malouin et al. |
| 2022/0408592 | A1 | 12/2022 | Malouin et al. |
| 2023/0048500 | A1 | 2/2023 | Malouin et al. |
| 2023/0154828 | A1 | 5/2023 | Haba et al. |
| 2023/0156959 | A1 | 5/2023 | Malouin et al. |
| 2023/0207474 | A1 | 6/2023 | Uzoh et al. |
| 2023/0245950 | A1 | 8/2023 | Haba et al. |
| 2023/0284421 | A1 | 9/2023 | Malouin et al. |
| 2023/0298969 | A1 | 9/2023 | Park et al. |
| 2023/0301038 | A1* | 9/2023 | Pouilly .............. H05K 7/20845 361/689 |
| 2023/0335472 | A1* | 10/2023 | Schuderer ............. H01L 25/071 |
| 2024/0038633 | A1 | 2/2024 | Haba et al. |
| 2024/0203823 | A1 | 6/2024 | Uzoh et al. |
| 2024/0222222 | A1 | 7/2024 | Haba et al. |
| 2024/0222226 | A1 | 7/2024 | Haba |
| 2024/0249995 | A1 | 7/2024 | Haba |
| 2024/0249998 | A1* | 7/2024 | Gao ...................... H01L 23/053 |
| 2024/0266255 | A1 | 8/2024 | Haba et al. |
| 2024/0387224 | A1* | 11/2024 | Sarode ............. H01L 21/68785 |
| 2024/0387324 | A1* | 11/2024 | Haba ................. H01L 23/49827 |

FOREIGN PATENT DOCUMENTS

| | | |
|---|---|---|
| CN | 115719735 A | 2/2023 |
| JP | 2000-340727 A | 12/2000 |
| KR | 10-1049508 B1 | 7/2011 |
| KR | 10-2023-0136509 A | 9/2023 |
| TW | 200834871 A | 8/2008 |
| WO | 2013/097146 A1 | 7/2013 |

OTHER PUBLICATIONS

"Single-Phase Direct-to-Chip Liquid Cooling," 6 pages, downloaded from https://jetcool.com/post/single-phase-direct-to-chip-liquid-cooling-microconvective-vs-microchannel-liquid-cooled-cold-plates/ on Mar. 7, 2024.

"Microconvective Liquid Cooling for high power electronics," https://jetcool.com/technology/, downloaded Mar. 7, 2024, 6 pages.

Benson D.A et al., "Micro-Machined Heat Pipes in Silicon MCM Substrates", Sandia National Laboratories, Sandia Report: SAND97-

(56) References Cited

OTHER PUBLICATIONS

0100-UC-704, printed Jan. 1997, 17 pages.

International Search Report and Written Opinion mailed Jun. 5, 2024, in International Application No. PCT/US2024/013758, 9 pages.

International Search Report and Written Opinion mailed Mar. 16, 2023, in International Application No. PCT/US2022/050105, 9 pages.

International Search Report and Written Opinion mailed May 30, 2023, in International Application No. PCT/US2023/061494, 9 pages.

Johnstone, Caitlin, "Coolant-on-Chip: Say Goodbye to Thermal Interfaces," jetcool, Jun. 9, 2020, https://jetcool.com/post/coolant-on-chip-say-goodbye-to-thermal-interfaces/, downloaded Feb. 29, 2024, 7 pages.

Walsh, Stephen Michael, "Microjet Impingement Cooling of High Power-Density Electronics," Thesis, submitted May 11, 2018, 93 pages.

Evan G. Colgan, "A Practical Implementation Of Silicon Microchannel Coolers", available online at <https://www.electronics-cooling.com/2007/11/a-practical-implementation-of-silicon-microchannel-coolers/>, Nov. 1, 2007, 10 pages.

Francisco Pires, "TSCM Exploring On-Chip, Semiconductor-Integrated Watercooling", tom's Hardware, retrieved from https://www.tomshardware.com/news/tsmc-exploring-on-chip-semiconductor-integrated-watercooling, Jul. 13, 2021, 23 pages.

IBM, "Functional electronic packaging-Thermal management roadmap", available online at <https://web.archive.org/ web/20170220095511/ https://www.zurich.ibm.com/st/electronicpackaging/cooling.html>, Feb. 20, 2017, 7 pages.

International Search Report and Written Opinion received for PCT Patent Application No. PCT/US23/28942, mailed on Nov. 16, 2023, 12 pages.

International Search Report and Written Opinion received for PCT Patent Application No. PCT/US23/84874, mailed on Apr. 22, 2024, 7 pages.

International Search Report and Written Opinion received for PCT Patent Application No. PCT/US23/85801, mailed on Apr. 26, 2024, 8 pages.

International Search Report and Written Opinion received for PCT Patent Application No. PCT/US23/85816, mailed on Apr. 23, 2024, 11 pages.

International Search Report and Written Opinion received for PCT Patent Application No. PCT/US23/86233, mailed on Apr. 26, 2024, 7 pages.

Kaplan, F. et al, "LoCool: Fighting Hot Spots Locally for System Energy Efficiency" IEEE Transactions on Computer-Aided Design of Intergrated Circuits and Systems, 39(4):895-908 (2020).

U.S. Appl. No. 18/129,567, filed Mar. 31, 2023, First Name Inventor: Cyprian Emeka Uzoh, "Embedded Cooling Systems for Device Packages and Methods of Cooling Packaged Devices".

PCT Application No. PCT/US2024/022253, International Search Report and Written Opinion dated Jul. 17, 2024, 14 pages.

Shamsa, M., et al., "Thermal conductivity of diamond-like carbon films", Applied Physics Letters, vol. 89, No. 16, Oct. 20, 2006, pp. 161921-161921-3.

Wu, C. J., et al., "Ultra High Power Cooling Solution for 3D-Ics", 2021 Symposium on VLSI Technology, Jun. 2021, 2 pages.

U.S. Appl. No. 18/393,016, filed Dec. 21, 2023, First Name Inventor: Gill Fountain, "Integrated Cooling Assemblies for Advanced Device Packaging and Methods of Manufacturing the Same".

\* cited by examiner

STRUCTURES AND METHODS FOR INTEGRATED COLD PLATE IN XPUS AND MEMORY

CROSS-REFERENCE TO RELATED APPLICATIONS

This application claims the benefit of U.S. Provisional Patent Application No. 63/651,843, filed May 24, 2024, and U.S. Provisional Patent Application No. 63/689,428, filed Aug. 30, 2024, both of which are incorporated by reference herein in their entireties.

BACKGROUND

The present disclosure relates to advanced packaging for microelectronic devices, and in particular, cooling systems for device packages and methods of manufacturing the same.

SUMMARY

Energy consumption poses a critical challenge for the future of large-scale computing as the world's computing energy requirements are rising at a rate that most would consider unsustainable. Some models predict that the information, communication and technology (ICT) ecosystem could exceed 20% of global electricity use by 2030, with direct electrical consumption by large-scale computing centers accounting for more than one-third of that energy usage. A significant portion of the energy used by such large-scale computing centers is devoted to cooling, since even small increases in operating temperatures can negatively impact the performance of microprocessors, memory devices, and other electronic components. While some of this energy is expended to operate the cooling systems that are directly cooling the chips (e.g., heat spreaders, heat pipes, etc.), energy consumption/costs for indirect cooling can also be quite staggering. Indirect cooling energy costs include, for example, cooling or air conditioning of data center buildings. Data center buildings can house thousands, to tens of thousands or more, of high performance chips in server racks, and each of those high performance chips is a heat source. An uncontrolled ambient temperature in a data center will adversely affect the performance of the individual chips, and the data center system performance as a whole.

Thermal dissipation in high-power density chips (semiconductor devices/die) is also a critical challenge as improvements in chip performance (e.g., through increased gate or transistor density due to advanced processing nodes, evolution of multi-core microprocessors, etc.) have resulted in increased power density and a corresponding increase in thermal flux that contributes to elevated chip temperatures. Higher density of transistors also increases the length of metal wiring on the chips, which generates its own additional thermal flux due to Joule heating of these wires due to higher currents. These elevated temperatures are undesirable as they can degrade the chip's operating performance, efficiency, reliability, and amount of remaining life. Cooling systems used to maintain the chip at a desired operating temperature typically remove heat using one or more heat dissipation devices (e.g., thermal spreaders, heat pipes, cold plates, liquid cooled heat pipe systems, thermal-electric coolers, heat sinks, etc.). One or more thermal interface material(s) (e.g., thermal paste, thermal adhesive, or thermal gap filler) may be used to facilitate heat transfer between the surfaces of a chip and heat dissipation device(s). A thermal interface material(s) (TIM(s)) is any material that is inserted between two components to enhance the thermal coupling therebetween. Unfortunately, the combined thermal resistance of (i) the thermal resistance of interfacial boundary regions between a TIM(s) and the chip and/or the heat dissipation device(s), and (ii) the thermal resistance of a thermal interface material(s) itself can inhibit heat transfer from the chip to the heat dissipation devices, undesirably reducing the cooling efficiency of the cooling system.

Generally speaking, there are multiple components between the heat dissipating sources (i.e., active circuitry) in the chips and the heat dissipation devices, each of which contributes to the system thermal resistance cumulatively along the heat transfer paths and raises chip junction temperatures from the ambient.

Such cooling systems can suffer from reduced cooling efficiency due to the design and manufacture of system components. Accordingly, there exists a need in the art for improved energy-efficient cooling systems, by reducing system thermal resistance, and methods of manufacturing the same.

In some embodiments, thermal dissipation is increased by the integration of active and passive cold plate elements into a device package. The device package may include one or more of a high bandwidth memory (HBM), a central processing unit (CPU), a graphical processing unit (GPU), a data processing unit (DPU), an infrastructure processing unit (IPU), a neural processing unit (NPU), and/or a tensor processing unit (TPU). Integrating the cold plate elements into the device package may include bonding one or more cooling elements to the device package. However, achieving proper bonding often requires a dielectric on a surface that is particularly smooth and clean, which is often not present in device packages. Accordingly, there exists a need in the art for improved methods of attaching cold plate elements to device packages.

BRIEF DESCRIPTION OF THE DRAWINGS

The above and other objects and advantages of the disclosure will be apparent upon consideration of the following detailed description, taken in conjunction with the accompanying drawings, in which.

Figure 1:
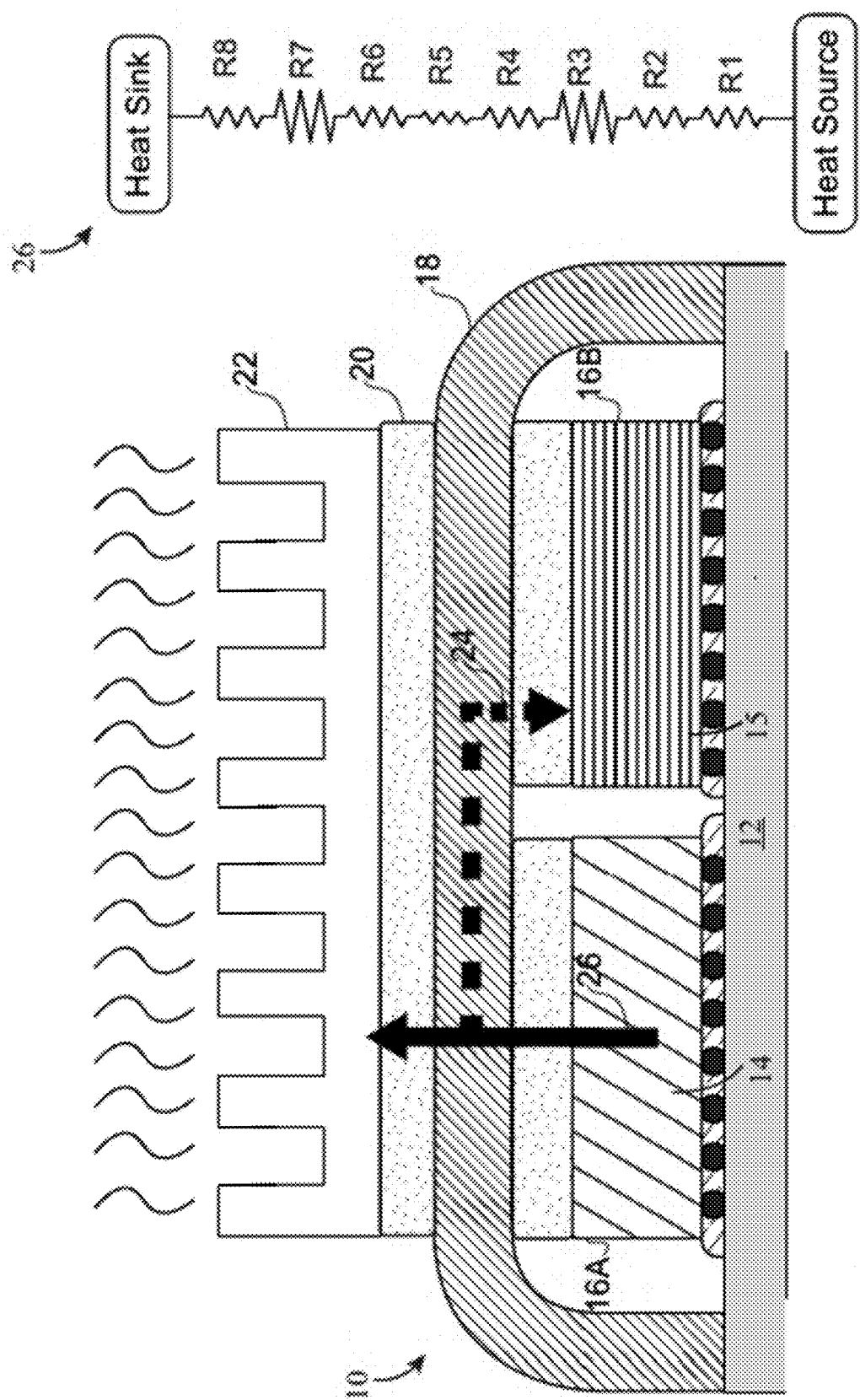
FIG. 1 illustrates a device package with an external heat sink.

The figures herein depict various embodiments of the present disclosure for purposes of illustration only. It will be appreciated that additional or alternative structures, assemblies, systems, and methods may be implemented within the principles set out by the present disclosure.

DETAILED DESCRIPTION

As used herein, the term "substrate" means and includes any workpiece, wafer, or article that provides a base material or supporting surface from which or upon which components, elements, devices, assemblies, modules, systems, or features of the heat-generating devices, packaging components, and cooling assembly components described herein may be formed or mounted. The term "substrate" also includes semiconductor substrates that provide a supporting material upon which elements of a semiconductor device are fabricated or attached, and any material layers, features, and/or electronic devices formed thereon, therein, or therethrough. Examples of substrate material that may be used in applications that generate high thermal density include, but are not limited to, Si, GaN, SiC, InP, GaP, InGaN, AlGaInP, AlGaAs, etc.

As described below, the semiconductor substrates herein generally have a "device side," (e.g., the side on which semiconductor device elements are fabricated, such as transistors, resistors, and capacitors) and a "backside" that is opposite the device side. The term "active side" should be understood to include a surface of the device side of the substrate and may include the device side surface of the semiconductor substrate and/or a surface of any material layer, device element, or feature formed thereon or extending outwardly therefrom, and/or any openings formed therein. Thus, it should be understood that the material(s) that forms the active side may change depending on the stage of device fabrication and assembly. Similarly, the term "non-active side" (opposite the active side) includes the non-active side of the substrate at any stage of device fabrication, including the surfaces of any material layer, any feature formed thereon, or extending outwardly therefrom, and/or any openings formed therein. Thus, the terms "active side" or "non-active side" may include the respective surfaces of the semiconductor substrate at the beginning of device fabrication and any surfaces formed during material removal (e.g., after substrate thinning operations). Depending on the stage of device fabrication or assembly, the terms "active sides" and "non-active sides" are also used to describe surfaces of material layers or features formed on, in, or through the semiconductor substrate, whether or not the material layers or features are ultimately present in the fabricated or assembled device. For example, in some instances, the term "active side" is used to indicate a surface of a substrate that will in the future, but does not yet, include semiconductor device elements.

Spatially relative terms are used herein to describe the relationships between elements, such as the relationships between substrates, heat-generating devices, cooling assembly components, device packaging components, and other features described below. Unless the relationship is otherwise defined, terms such as "above," "over," "upper," "upwardly," "outwardly," "on," "below," "under," "beneath," "lower," "top," "bottom" and the like are generally made with reference to the X, Y, and Z directions set forth by X, Y and Z axes in the drawings. Thus, it should be understood that the spatially relative terms used herein are intended to encompass different orientations of the substrate and, unless otherwise noted, are not limited by the direction of gravity. Unless the relationship is otherwise defined, terms describing the relationships between elements such as "disposed on," "embedded in," "coupled to," "connected by," "attached to," "bonded to," and the like, either alone or in combination with a spatially relevant term, include both relationships with intervening elements and direct relationships where there are no intervening elements. Furthermore, the term "horizontal" is generally made with reference to the X-axis direction and the Y-axis direction set forth in the drawings. The term "vertical" is generally made with reference to the Z-axis direction set forth in the drawings.

Various embodiments disclosed herein include bonded structures in which two or more elements are directly bonded to one another without an intervening adhesive (referred to herein as "direct bonding," "direct dielectric bonding," or "directly bonded"). The resultant bonds formed by this technique may be described as "direct bonds" and/or "direct dielectric bonds." In some embodiments, direct bonding includes the bonding of a single material on the first of the two or more elements and a single material on a second one of the two or more elements, where the single material on the different elements may or may not be the same. For example, bonding a layer of one inorganic dielectric (e.g., silicon oxide) to another layer of the same or different inorganic dielectric. As discussed in more detail below, the process of direct bonding (e.g., direct dielectric bonding) provides a reduction of thermal resistance between a semiconductor device and a cold plate. Examples of dielectric materials used in direct bonding include oxides, nitrides, oxynitrides, carbonitrides, and oxycarbonitrides, etc., such as, for example, silicon oxide, silicon nitride, silicon oxynitride, silicon carbonitride, silicon oxycarbonitride, etc. Direct bonding can also include bonding of multiple materials on one element to multiple materials on the other element (e.g., hybrid bonding). As used herein, the term "hybrid bonding" refers to a species of direct bonding having both i) at least one (first) nonconductive feature directly bonded to another (second) nonconductive feature, and ii) at least one (first) conductive feature directly bonded to another (second) conductive feature, without any intervening adhesive. The resultant bonds formed by this technique may be described as "hybrid bonds" and/or "direct hybrid bonds." In some hybrid bonding embodiments, there are many first conductive features, each directly bonded to a second conductive feature, without any intervening adhesive. In some embodiments, nonconductive features on the first element are directly bond to nonconductive features of the second element at room temperature without any intervening adhesive, which is followed by bonding of conductive features of the first element directly bonded to conductive features of the second element via annealing at slightly higher temperatures (e.g., >100° C., >200° C., >250° C., >300° C., etc.).

Unless otherwise noted, the terms "cooling assembly" and "integrated cooling assembly" generally refer to a semiconductor device and a cold plate attached to the semiconductor device. Typically, the cold plate is formed with recessed surfaces that define one or more fluid cavities (e.g., coolant chamber volume(s) or coolant channel(s)) between the cold plate and the semiconductor device. In embodiments where the cold plate is formed with plural fluid cavities, each fluid cavity may be defined by cavity dividers and/or sidewalls of the cold plate. For example, cavity dividers may be spaced apart from each other and extend laterally between opposing cold plate sidewalls (e.g., in one direction between a first pair of opposing cold plate sidewalls, or in two directions between orthogonal pairs of opposing cold plate sidewalls). The cavity dividers and the cold plate sidewalls may collectively define adjacent fluid cavities therebetween. The cold plate may comprise a polymer material.

The cold plate may be attached to the semiconductor device by use of a compliant adhesive layer or by direct bonding or hybrid bonding. Direct bonding may include direct dielectric bonding techniques as described herein, and may give rise to direct dielectric bonds. Hybrid bonding may include hybrid bonding techniques as described herein, and may give rise to direct hybrid bonds. For example, the cold plate may include material layers and/or metal features that facilitate direct bonding or hybrid bonding with the semiconductor device. Beneficially, the backside of the semiconductor device is directly exposed to coolant fluids flowing through the integrated cooling assembly, thus providing for direct heat transfer therebetween. Unless otherwise noted, the integrated cooling assemblies described herein may be used with any desired fluid (e.g., liquid, gas, and/or vapor-phase coolants, such as water, glycol, etc.). In some embodiments, the coolant fluid(s) may contain additives to enhance the conductivity of the coolant fluid(s) within the integrated cooling assemblies. The additives may comprise, for example, nano-particles of carbon nanotubes, nano-particles of graphene, and/or nano-particles of metal oxides. The concentration of these nano-particles may be less than 1%, less than 0.2%, or less than 0.05%. The coolant fluids may also contain a small amount of glycol or glycols (e.g., propylene glycol, ethylene glycol, etc.) to reduce frictional shear stress and drag coefficient in the coolant fluid(s) within the integrated cooling assembly.

Exemplary fluids available for use in the various thermal solution embodiments include: water (either purified or deionized), a glycol (e.g., ethylene glycol, propylene glycol), glycols mixed with water (e.g., ethylene glycol mixed with water (EGW) or propylene glycol mixed with water (PGW)), dielectric fluids (e.g. fluorocarbons, polyalphaolefin (PAO), isoparaffins, synthetic esters, or very high viscosity index (VHVI) oils), or mineral oils. Additionally, depending upon design and operating conditions, these fluids may be used in single-phase liquid, single-phase vapor, two-phase liquid/vapor or two-phase solid/liquid. All of these fluids and fluid mixtures will alter the thermohydraulic and heat transfer properties by altering the temperatures where phase change occurs, as well as meeting design temperature and pressure conditions for the component being cooled or warmed and the thermal solution being deployed. Additionally, multiple combinations of the fluid phases may be employed in various hybrid configurations to meet the particular cooling or warming needs of a respective implementation and still be within the scope of the contemplated embodiments.

Additionally, in some embodiments part or all the cooling is provided by gases. Exemplary gases include atmospheric air and/or one or more inert gases such as nitrogen. Atmospheric air may be taken to mean the mixture of different gases in Earth's atmosphere made up of about 78% nitrogen and 21% oxygen.

Depending on the design needs of a thermal solution system using the disclosed embodiments, engineered dielectric cooling fluids may be used. Some examples of dielectric fluids used for cooling semiconductors include: 3M™ Fluorinert™ Liquid FC-40-A non-flammable, dielectric fluid that can be used in direct contact with live electronics; 3M™ Novec™ Engineered Fluids-A non-flammable, dielectric fluid that can be used in direct contact with live electronics; Galden® PFPE (perfluoropolyether) products used as heat transfer fluids; EnSolv Fluoro HTF—A solvent with a high boiling point and low pour point that can be used for semiconductor wafer cooling. It is understood that in the selection of the cooling fluid, system design aspects such as operating temperatures and pressures, fluid flow rates, fluid viscosity, and other properties will require evaluation when selecting the appropriate cooling fluid.

In some embodiments, the cooling fluids may contain microparticles and/or nanoparticle additives to enhance the conductivity of the cooling fluid within the integrated cooling assemblies. Choi and Eastman (1995) from Argonne National Laboratory, U.S.A. (Yu et al., 2007) coined the word "nanofluid." Nanofluids are engineered fluids prepared by suspending the nano-sized (1-100 nm) particles of metals/non-metals and their oxide(s) with a base/conventional fluid. The suspension of high thermal conductivity metals/non-metals and their oxides nanoparticles enhances the thermal conductivity and heat transfer ability, etc. of the base fluid. The additives to the underlying cooling fluid may comprise for example, nanoparticles of carbon nanotube, nanoparticles of graphene, or nanoparticles of metal oxides. When the cooling fluid contains microparticles, the microparticles are typically 10 microns or less in diameter. Silicon oxide microparticles may be used.

The volume concentration of these micro or nanoparticles may be less than 1%, less than 0.2%, or less than 0.05%. Depending upon the liquid and micro/nanoparticle type chosen for the cooling fluid, higher volume concentrations of 10% or less, 5% or less, or 2% or less may be used. The cooling fluids may also contain small amounts of glycol or glycols (e.g. propylene glycol, ethylene glycol etc.) to reduce frictional shear stress and drag coefficient in the cooling fluid within the integrated cooling assembly. The availability of different base fluids (e.g., water, ethylene glycol, mineral or other stable oils, etc.) and different nanomaterials provide a variety of nanomaterial options for nanofluid solutions to be used in the various embodiments. These nanomaterial option groups such as aforementioned metals (e.g., Cu, Ag, Fe, Au, etc.), metal oxides (e.g., TiO2, Al2O3, CuO, etc.), carbons (e.g. CNTS, graphene, diamond, graphite . . . etc.), or a mixture of different types of nanomaterials. Metal nanoparticles (Cu, Ag, Au . . . ), metal oxide nanoparticles (Al2O3, TiO2, CuO), and carbon-based nanoparticles are commonly employed elements. Silicon oxide nanoparticles may also be used. Using cooling fluids with micro and/or nanoparticles when practicing the various embodiments disclosed herein can result in increased heat removal efficiencies and effectiveness.

The fluid control design aspects of specific embodiments may require the nanofluids to be magnetic to facilitate either movement or cessation of movement of the fluids within the semiconductor structures. Magnetic nanofluids (MNFs) are suspensions of a non-magnetic base fluid and magnetic nanoparticles. Magnetic nanoparticles may be coated with surfactant layers such as oleic acid to reduce particle agglomeration and/or settling. Magnetic nanoparticles used in MNFs are usually made of metal materials (ferromagnetic materials) such as iron, nickel, cobalt, as well as their oxides such as spinel-type ferrites, magnetite (Fe3O4), and so forth. The magnetic nanoparticles used in MNFs typically range in size from about 1 to 100 nanometers (nm).

This disclosure describes embodiments involving the architecture of system and component elements that can be employed to provide for the cooling of semi-conductor components, packaging, and boards. However, those skilled in the art will appreciate the disclosed components and arrangements can be deployed and used in scenarios where component heat up or thermal warm up is desired for a component that is currently outside the low end of the desired operational range. Components that are outside the low end of their operational range can, if started in a cold environment, experience thermal warping or cracking up to and including thermal overexpansion and contact separation that may impair the successful operation of the system. Therefore, in these scenarios, the architectures and embodiments disclosed herein can be used where the indirect thermal solutions supporting them are repurposed or operated in a hybrid configuration to provide warming fluids or heat transfer media to accomplish the warm-up or heat-up scenario. These scenarios are controlled by systems not shown here to bring temperatures up at a speed or timing that enables the materials to avoid the excessive thermal expansion or unequal thermal expansion that may occur among the materials of the semiconductor or packaging being serviced by the thermal solution. Once the component or packaging is brought up into the normal operating range, it can be safely started and brought to a useful operational state.

Considering the warm-up or heat-up embodiments introduced above, the balance of this disclosure and terms used should be viewed in a light that also considers the design option for such warm-up or heat-up. Thus, where terms such as cooling channel, cooling chamber volume, and cooling port are used, for example, such terms could also be considered as a thermal control channel, a thermal control volume, or a thermal control port, respectively. A person of skill would understand that heat flux or heat transfer would go in a different direction, but the design concepts are similar and can be successfully employed in the various embodiments.

In some embodiments, a cooling channel is a liquid cooling channel, and a liquid may flow through the liquid cooling channel. In some embodiments, the liquid may comprise a water and/or glycol (e.g., propylene glycol, ethylene glycol, and mixtures thereof).

As described below, coolant fluid flowing through a cold plate may be used to control the temperature of semiconductor devices. The fluid flowing across the surface of the semiconductor device absorbs heat and conducts heat away from the semiconductor device.

FIG. 1 is a schematic side view of a device package 10 and a heat sink 22 attached to the device package 10. The device package 10 typically includes a package substrate 12, a first device 14, a device stack 15, a heat spreader 18, and first TIM layers 16A, 16B thermally coupling the first device 14 and the device stack 15 to the heat spreader 18. The device package 10 is thermally coupled to the heat sink 22 through a second TIM layer 20. The TIM layers 16A, 16B, 20 facilitate thermal contact between components in the device package 10 and between the device package 10 and the heat sink 22.

As heat flux density increases with increasing power density in advanced semiconductor devices, the cumulative thermal resistance of the system illustrated in FIG. 1 is increasingly problematic as heat cannot be dissipated quickly enough to allow semiconductor devices to run at optimal power. Consequently, the energy efficiency of semiconductor devices is reduced. Furthermore, heat is transferred between semiconductor devices within the device package 10, as shown with heat transfer path 24 (illustrated as a dashed line), where heat may be undesirably transferred from the first device 14 having a high heat flux, such as a central processing unit (CPU) or a graphical processing unit (GPU), to the device stack 15 having low heat flux, such as memory, through the heat spreader 18.

For example, as shown in FIG. 1, each device package component and the respective interfacial boundaries therebetween have a corresponding thermal resistance that forms heat transfer path 26 (illustrated by arrow 26 in FIG. 1). The right-hand side of FIG. 1 illustrates the heat transfer path 26 as a series of thermal resistances R1-R8 between a heat source and a heat sink. Here, R1 is the thermal resistance of the bulk semiconductor material of the first device 14. R3 and R7 are the thermal resistances of the first TIM layers 16A, 16B and the second TIM layer 20, respectively. R5 is the thermal resistance of the heat spreader 18. R2, R4, R6, and R8 represent the thermal resistance at the interfacial region of the components (e.g., contact resistances). In a typical cooling system, R3 and R7 may account for 80% or more of the cumulative thermal resistance of the heat transfer path 26, and R5 may account for 5% or more. R1 of the first device 14 and R2, R4, R6, and R8 of the interfaces account for the remaining cumulative thermal resistance. Accordingly, embodiments described herein provide for integrated cooling assemblies embedded within a device package. The embedded cooling assemblies shorten the thermal resistance path between a semiconductor device and a heat sink and reduce thermal communication between semiconductor devices disposed in the same device package, such as described in relation to the figures below.

Figure 2A:
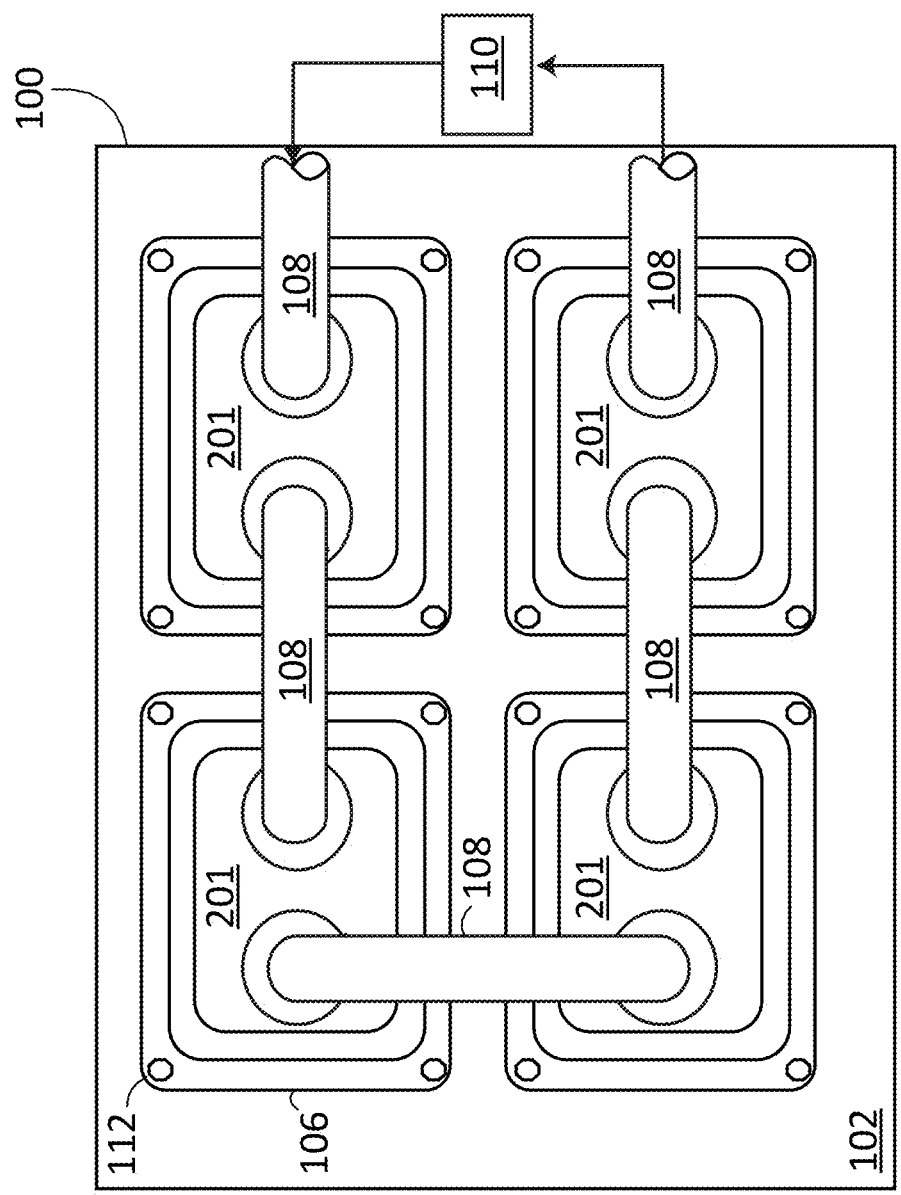
FIG. 2A is a schematic plan view of an example of a system panel, in accordance with embodiments of the present disclosure.

FIG. 2A is a schematic plan view of an example of a system panel 100, in accordance with embodiments of the present disclosure. Generally, the system panel 100 includes a printed circuit board (PCB) 102, a plurality of device packages 201 mounted to the PCB 102, and a plurality of coolant lines 108 fluidly coupling each of the device packages 201 to a coolant source 110. It is contemplated that coolant fluid may be delivered to each of the device packages 201 in any desired fluid phase (e.g., liquid, vapor, gas, or combinations thereof) and may flow out from each device package 201 in the same phase or a different phase. In some embodiments, the coolant fluid is delivered to the device packages 201 and returned therefrom as a liquid, whereby the coolant source 110 may comprise a heat exchanger or chiller to maintain the coolant fluid at a desired temperature. In other embodiments, the coolant fluid may be delivered to the device packages 201 as a liquid, vaporized to a vapor within the device packages 201, and returned to the coolant source 110 as a vapor. In those embodiments, the device packages 201 may be fluidly coupled to the coolant source 110 in parallel, and the coolant source 110 may include or further include a compressor (not shown) for condensing the received vapor to a liquid form.

Figure 2B:
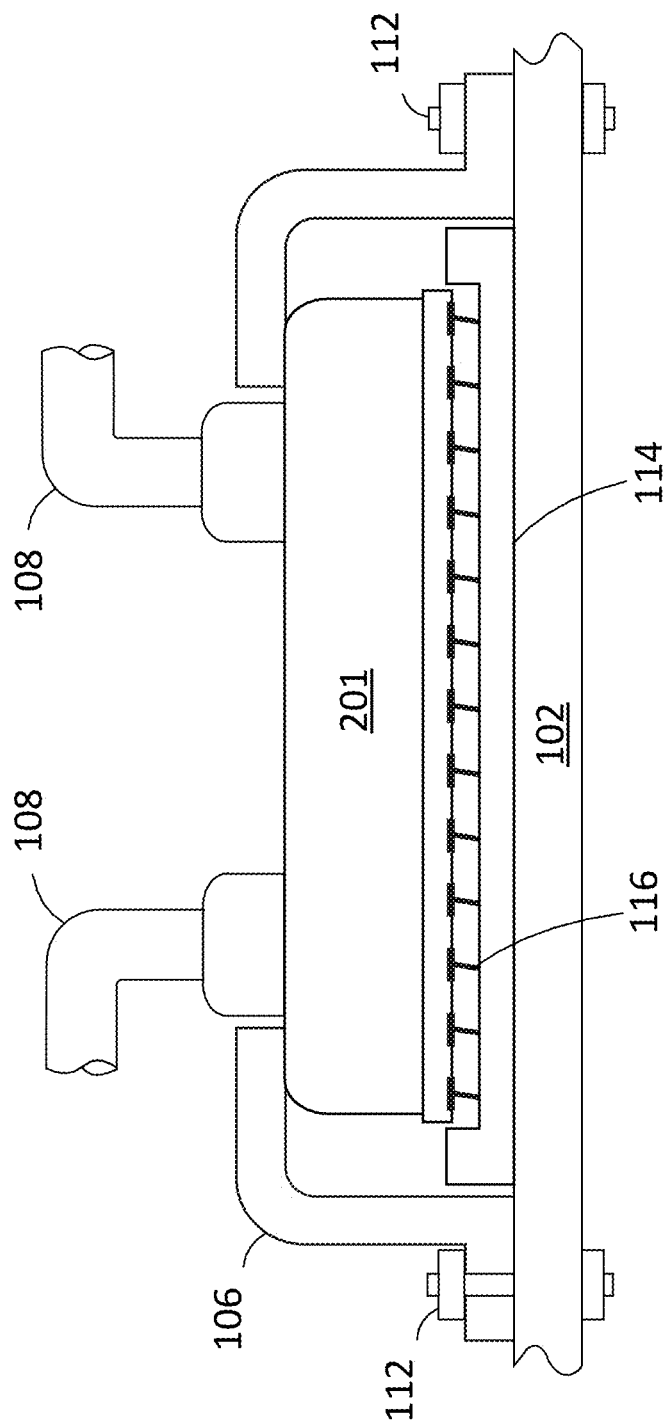
FIG. 2B is a schematic partial sectional side view of a portion of the system panel, in accordance with embodiments of the present disclosure.

FIG. 2B is a schematic partial sectional side view of a portion of the system panel 100 of FIG. 2A. As shown, each device package 201 is fluidly coupled to the plurality of coolant lines 108 and is disposed in a socket 114 of the PCB 102 and connected thereto using a plurality of pins 116, or by other suitable connection methods, such as solder bumps (not shown). The device package 201 may be seated in the socket 114 and secured to the PCB 102 using a mounting frame 106 and a plurality of fasteners 112 (e.g., compression screws) collectively configured to exert a relatively uniform downward force on the upward facing edges of the device package 201. The uniform downward force ensures proper pin contact between the device package 201 and the socket 114.

Figure 2C:
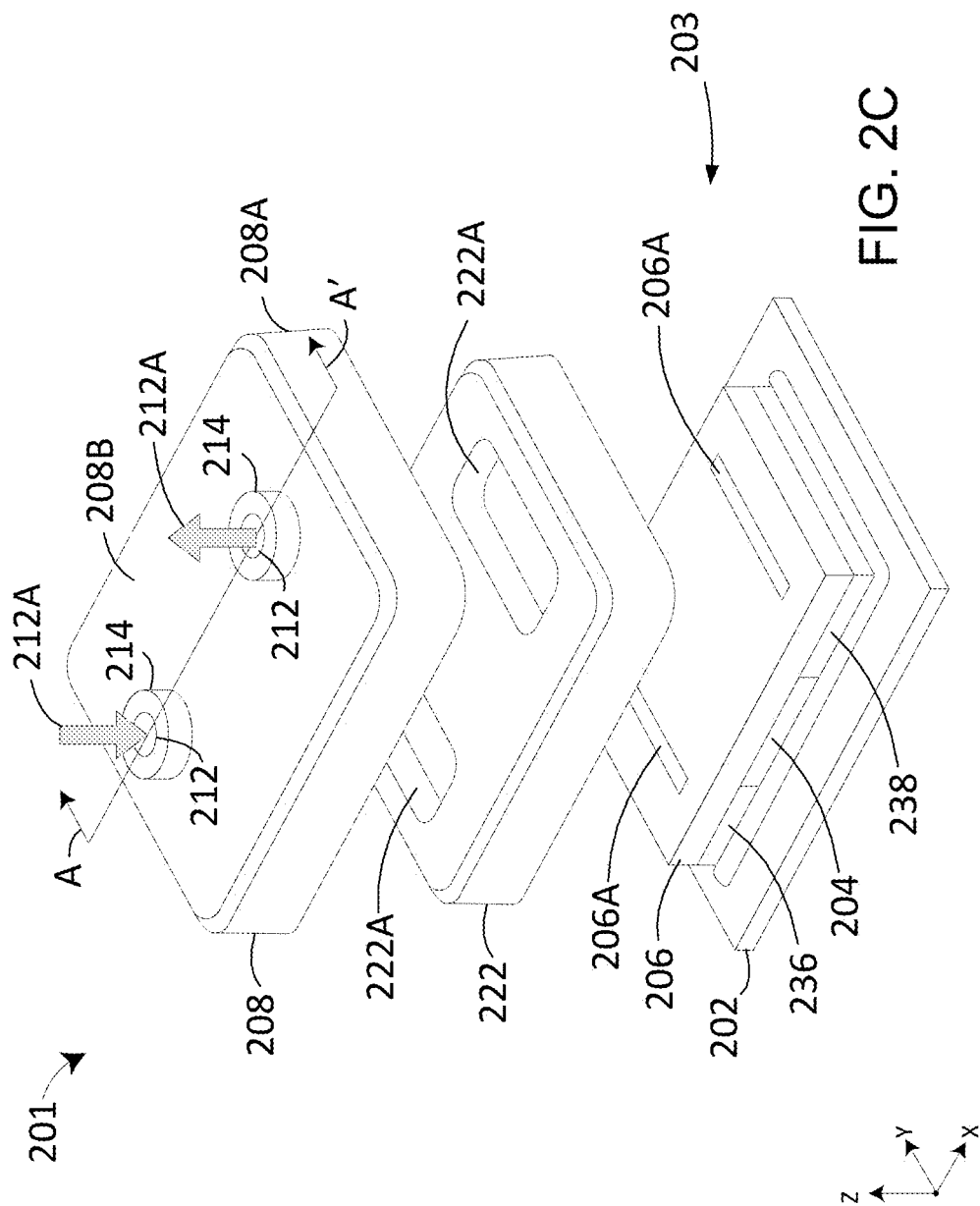
FIG. 2C is a schematic exploded isometric view of a multi-component device package, in accordance with embodiments of the present disclosure.

FIG. 2C is a schematic exploded isometric view of an example multi-component device package 201, in accordance with embodiments of the present disclosure. Generally, the device package 201 includes a package substrate 202, an integrated cooling assembly 203 disposed on the package substrate 202, and a package cover 208 disposed on a peripheral portion of the package substrate 202. Suitable materials that may be used in the package cover 208 include copper, aluminum, metal alloys, etc. The package cover 208 extends over the integrated cooling assembly 203 so that the integrated cooling assembly 203 is disposed between the package substrate 202 and the package cover 208. The integrated cooling assembly 203 typically includes a semiconductor device 204 and a cold plate 206 bonded to the semiconductor device 204. In some embodiments, the integrated cooling assembly 203 includes more than one semiconductor device. For example, the integrated cooling assembly 203 may include the semiconductor device 204, a second semiconductor device 236, and a third semiconductor device 238 and the integrated cooling assembly 203 may be bonded to one or more or all three semiconductor devices.

In some embodiments, the cold plate 206 may comprise substrate material like silicon, glass, ceramic, etc. Although the lateral dimensions (or footprint) of the cold plate 206 are shown to be the same or similar to the combined lateral dimensions (or footprint) of the semiconductor device 204, second semiconductor device 236, and the third semiconductor device 238, the footprint of the cold plate 206 may be smaller or larger in one or both directions when compared to the combined footprint of the semiconductor devices.

As shown, the device package 201 further includes a sealing material layer 222 that forms a coolant fluid impermeable barrier between the package cover 208 and the integrated cooling assembly 203 that prevents leaking of the coolant fluid outside of the cooling assembly and prevents coolant fluid from reaching an active side 218 (discussed below in relation to FIG. 3) of the semiconductor device 204 and causing damage thereto. In some embodiments, the sealing material layer 222 comprises an adhesive material that reliably attaches the package cover 208 to the integrated cooling assembly 203. In some embodiments, the sealing material layer 222 comprises a polymer or epoxy material that extends upwardly from the package substrate 202 to encapsulate and/or surround at least a portion of the semiconductor device 204. In some embodiments, the sealing material layer 222 may also comprise conductive material (e.g., solder). In other embodiments, the sealing material layer 222 is formed from a molding compound (e.g., a thermoset resin) that when polymerized, forms a hermetic seal between the package cover 208 and the cold plate 206. Here, the coolant fluid is delivered to the cold plate 206 through openings 222A disposed through the sealing material layer 222. As shown, the openings 222A are respectively in registration and fluid communication with inlet and outlet openings 212 of the package cover 208 thereabove and inlet and outlet openings 206A in the cold plate 206 therebelow.

It will be understood that the openings are shown in a section view. The openings may have any cross-sectional shape that allows fluid to flow therethrough (e.g., rectangular, square, hexagonal or circular cross-sections). For example, the inlet and outlet openings 206A of the cold plate 206 may form an elongated shape extending from one side of the cold plate 206 to another side of the cold plate 206. For example, the inlet and outlet openings 206A may form any shape having a length greater than a width in the X-Y plane (e.g., a rectangular or a trapezoidal shape). A shape in the X-Y plane of the openings 222A disposed through the sealing material layer 222 may be substantially the same as the shape of the inlet and outlet openings 206A of the cold plate 206 in the same place. Furthermore, it will be understood that all references to an opening throughout the present disclosure refer to an opening defined by a sidewall (e.g., opening sidewall).

Generally, the package substrate 202 includes a rigid material, such as an epoxy or resin-based laminate, that supports the integrated cooling assembly 203 and the package cover 208. The package substrate 202 may include conductive features disposed in or on the rigid material that electrically couples the integrated cooling assembly 203 to a system panel, such as the PCB 102.

Figure 3:
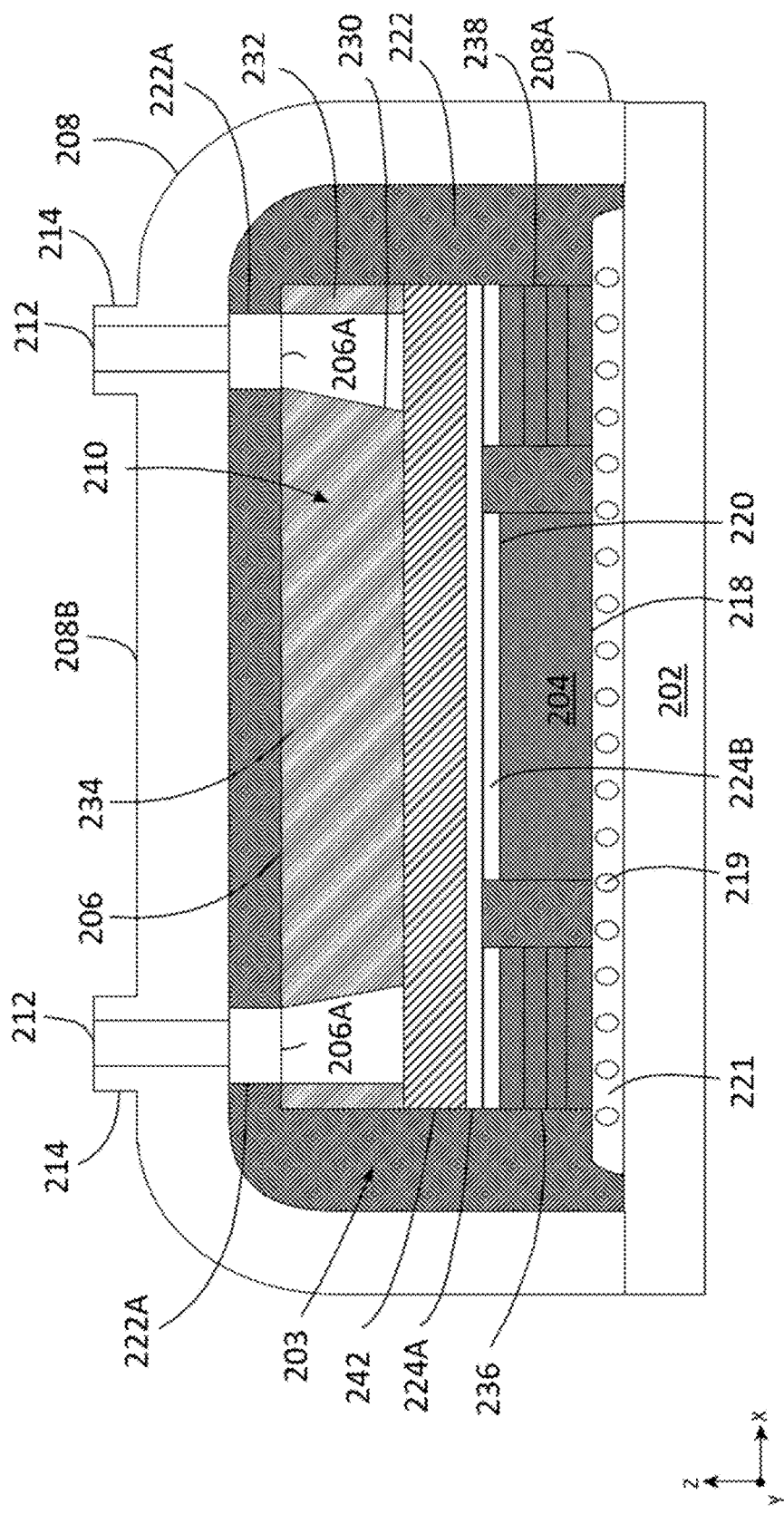
FIG. 3 is a schematic sectional view of an example multi-component device package, in accordance with embodiments of the present disclosure.

FIG. 3 is a schematic sectional view in the X-Z plane of the multi-component device package 201 taken along line A-A' of FIG. 2C. As illustrated in FIG. 3, the semiconductor device 204 includes the active side 218 that includes device components (e.g., transistors, resistors, and capacitors, formed thereon or therein), and a non-active side, here the semiconductor device backside 220, opposite the active side 218. As shown, the active side 218 is positioned adjacent to and facing towards the package substrate 202. The active side 218 may be electrically connected to the package substrate 202 by use of conductive bumps 219, which are encapsulated by a first underfill layer 221 disposed between the semiconductor device 204 and the package substrate 202. The first underfill layer 221 may comprise a cured polymer resin or epoxy, which provides mechanical support to the conductive bumps 219 and protects against thermal fatigue. In some embodiments, the active side 218 may be electrically connected to a package substrate, another active die, or another passive die (e.g., interposer) using hybrid bonding or conductive bumps 219. The cold plate 206 may be disposed above the package substrate 202 with the semiconductor device 204 disposed therebetween. For example, the semiconductor device 204 (and the first underfill layer 221) may be disposed between the cold plate 206 and the package substrate 202.

In some embodiments, the multi-component device package 201 comprises a plurality of devices (e.g., the semiconductor device 204, the second semiconductor device 236, and the third semiconductor device 238). One or more of the devices may be singulated and/or disposed in a vertical device stack (e.g., the second semiconductor device 236 and the third semiconductor device 238). The cold plate 206 may be attached to each of the devices (e.g., by the direct bonding methods described herein or other methods including flip chip bonding, etc.). In some embodiments, the semiconductor device 204 may comprise a processor, and the device stack(s) may comprise a plurality of memory devices. Here, the devices are disposed in a side-by-side arrangement on the underfill layer 221 and are in electrical communication with one another through conductive elements formed in, on, or through the underfill layer 221. Here, the cold plate 206 is sized to provide a bonding surface for attachment to all the devices, but may otherwise be the same or substantially similar to other cold plates described herein. In some embodiments, one or more sidewalls of the cold plate 206 may be aligned or offset to the vertical sidewalls of the devices (including inside or outside their footprint). In some embodiments, more than one cold plate 206 may be bonded. For example, separate cold plates may be bonded to the semiconductor device 204, the second semiconductor device 236, and the third semiconductor device 238.

Here, the cold plate 206 comprises a top portion 234, a sidewall 232 (e.g., a perimeter sidewall defining a perimeter of the cold plate 206), and a base plate 242. In some embodiments, the sidewall 232 extends downwardly from the top portion 234 to the base plate 242. The top portion 234, the perimeter sidewall 232, the base plate 242 and the backside 220 of the semiconductor device 204 collectively define a coolant channel 210. The cold plate 206 comprises cavity dividers 230 extending downwardly from the top portion 234 towards the base plate 242. The cavity dividers 230 may alternatively be referred to as support features 230, which provide structural support to the integrated cooling assembly 203. The cavity dividers 230 may extend laterally and in parallel between an inlet opening 206A of the cold plate 206 and an outlet opening 206A of the cold plate 206 to define coolant channels 210 therebetween. It should be appreciated that the cold plate 206 may comprise one cavity divider 230 which forms two coolant channels (e.g., one coolant channel on either side of the cavity divider 230) by means of the cavity divider 230 and portions of the perimeter sidewall 232. More specifically, coolant channels 210 may be formed between the cavity divider 230 and a portion of the perimeter sidewall 232 extending parallel to the cavity divider 230. Alternatively, in other embodiments, the cold plate 206 may comprise plural cavity dividers 230, for example two cavity dividers, five cavity dividers, or six cavity dividers. In such examples, the cold plate 206 comprises more than two coolant channels 210, for example three coolant channels, four coolant channels, seven coolant channels, or more, defined between the cavity dividers 230 and/or the cavity divider(s) 230 and the perimeter sidewall 232.

The cavity dividers 230 comprise cavity sidewalls which form surfaces of corresponding coolant channels 210. In embodiments where plural cavity dividers 230 extend in parallel to each other, cavity sidewalls of adjacent cavity dividers 230 are opposite (e.g., facing) each other. In embodiments comprising a single cavity divider 230, a first cavity sidewall may be opposite (e.g., face) a first portion of the perimeter sidewall 232 extending parallel to and facing the first cavity sidewall. A second cavity sidewall may be opposite (e.g., face) a second portion of the perimeter sidewall 232 extending parallel to and facing the second cavity sidewall. The first portion of the perimeter sidewall 232 may be an opposite side of the cold plate 206 to the second portion of the perimeter sidewall 232. For example, in embodiments where the cold plate 206 is rectangular, first and second opposing sides of the rectangular cold plate 206 form the first and second portions of the perimeter sidewall 232.

The cavity dividers 230 may be continuous cavity dividers which extend continuously (e.g., in the Y-axis direction) between the inlet opening 206A and the outlet opening 206A of the cold plate 206.

With reference to FIG. 3, coolant channels 210 may be defined by:
  the base plate 242, which forms a portion of the coolant channel 210;
  portions of the perimeter sidewall 232 extending in the Y-axis direction, which form end surfaces of the coolant channels 210;
  the cavity sidewalls, which form inner surfaces of the coolant channels 210 in the X-axis direction; and
  portions of the perimeter sidewall 232 extending in the X-axis direction, which form outer surfaces of the coolant channels 210 in the X-axis direction.

Here, the cavity sidewalls are formed at an acute angle with respect to the backside 220 of the semiconductor device 204 and/or the base plate 242 such that upper portions of opposing (e.g., facing) cavity sidewalls meet. Therefore, the cavity sidewalls and the backside 220 of the semiconductor device 204 and/or the base plate 242 collectively define a triangular cross-section of the coolant channel 210.

In some embodiments, the backside 220 of the semiconductor device 204 comprises a corrosion protective layer (not shown). The corrosion protective layer may be a continuous layer disposed across the entire backside 220 of the semiconductor device 204, such that the cold plate 206 is attached thereto. Beneficially, the corrosion protective layer provides a corrosion-resistant barrier layer, thus preventing undesired corrosion of the semiconductor device 204 (e.g., the semiconductor substrate material which might otherwise be in direct contact with coolant fluid flowing through a coolant chamber volume 210).

One or more coolant chamber volumes may include one or more coolant channels. The coolant channels may extend between a single inlet opening and a single outlet opening of the cold plate 206, such that the coolant chamber volume(s) and/or coolant channel(s) share the same inlet and outlet openings. In some embodiments, multiple inlet and/or outlet openings may be coupled to the coolant chamber volume(s).

In embodiments having plural coolant chamber volumes and/or plural coolant channels, each coolant chamber volume and/or coolant channel may be connected between a separate inlet opening and a separate outlet opening. In such embodiments, the coolant fluid may be directed to the separate inlet openings and from the separate outlet openings using a manifold disposed above the openings in the Z-axis direction. In some embodiments, one or more gaskets are used to seal a gap between the manifold and one or more cold plate inlet/outlet openings. In some embodiments, the one or more gaskets are made of rubber or similar such material. The one or more gaskets may provide a water tight seal allowing coolant fluid to flow from the manifold into the one or more cold plate inlet/outlet openings. In some embodiments, the manifold is attached to one or more cold plates using the one or more gaskets.

In some embodiments, a height in the Z-axis direction of the coolant chamber volume(s) and or coolant channel(s) may be greater than 100 μm, 100 μm-1000 μm, or 100 μm-700 μm. A width in the Y-axis direction of the coolant chamber volume(s) and/or coolant channel(s) may be greater than 100 μm, 100 μm-1000 μm, or 100 μm-700 μm. For example, the width of the coolant chamber volume(s) and/or coolant channel(s) may be greater than the height. A cross-section of the coolant chamber volume(s) and/or coolant channel(s) in the Y-Z plane is wide enough to allow for a pressure drop of 0-20 psi, 3-15 psi, or 4-10 psi.

In some embodiments, preparing a desired surface roughness of the sidewalls of the coolant chamber volume(s) and/or coolant channels may include depositing an organic layer on a photoresist layer after cold plate features have been etched to form a micro-masking layer, such as between 1 to 30 nm. The micro-masking layer may be dry etched to form the desired surface roughness, such as between 0.1 to 3.0 nm.

Figure 4:
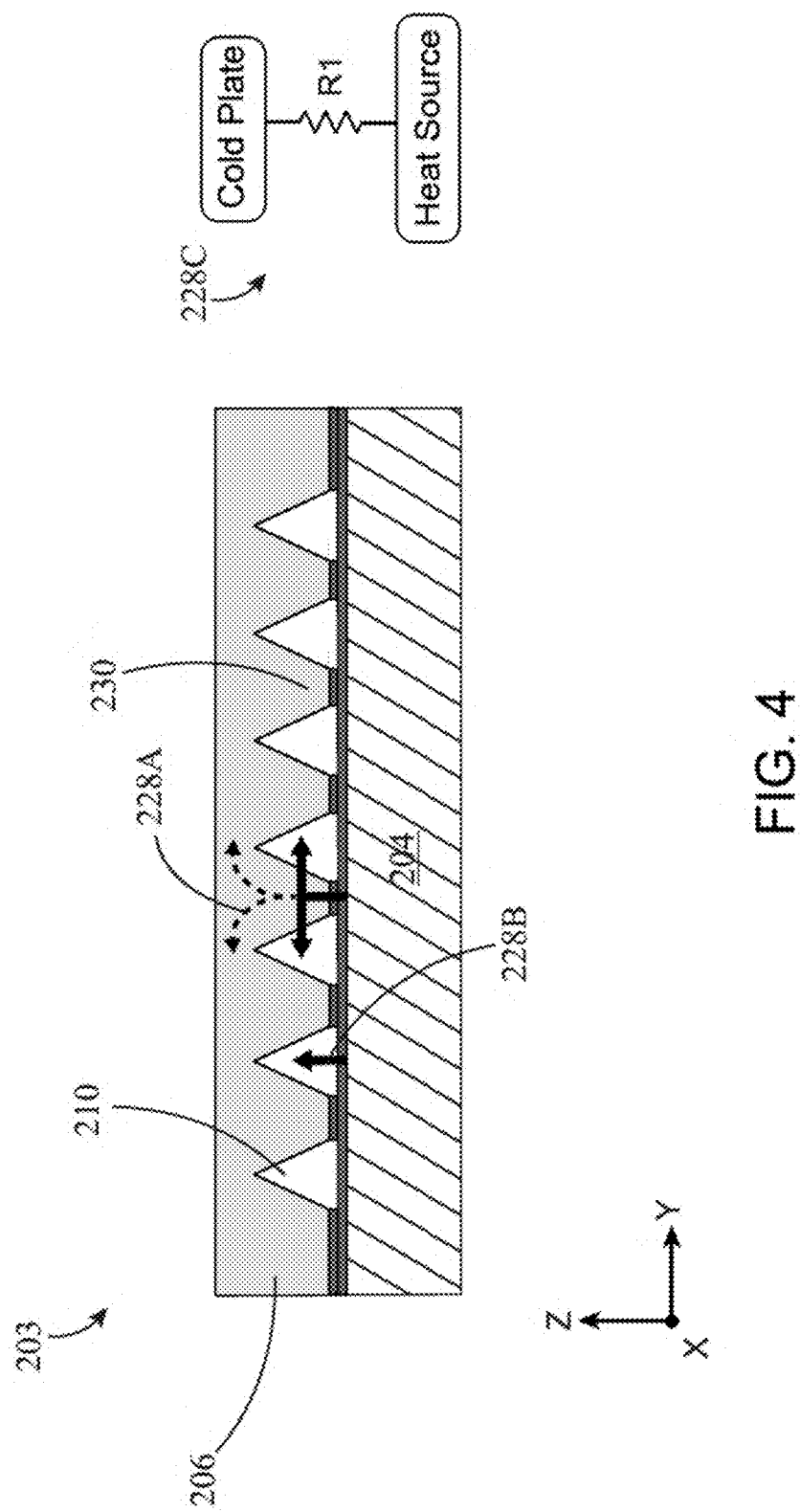
FIG. 4 is a schematic sectional view of an integrated cooling assembly of the multi-component device package, in accordance with embodiments of the present disclosure.

With reference to FIG. 3, the cold plate 206 is attached to the backside 220 of the device 204 without the use of an intervening adhesive. For example, the cold plate 206 may be directly bonded to the backside 220 of the device 204, such that the cold plate 206 and the backside 220 of the device 204 are in direct contact. For example, in some embodiments, one or both of the cold plate 206 and the backside 220 of the semiconductor device 204 may comprise a dielectric material layer (e.g., a first dielectric material layer 224A and a second dielectric material layer 224B respectively), and the cold plate 206 is directly bonded to the backside 220 of the semiconductor device 204 through bonds formed between the dielectric material layers 224A, 224B. In some embodiments, one of the cold plate 206 or the backside 220 of the semiconductor device 204 may comprise a thin bonding dielectric layer (e.g., silicon nitride, etc.) and other element(s) may not include any such explicit bonding dielectric layer (or can have only a native oxide layer). The first and second dielectric material layers 224A, 224B may be continuous or non-continuous. For example, the first dielectric material layer 224A may be disposed only on lower surfaces of the cold plate 206 facing the backside 220 of the semiconductor device 204. With reference to FIG. 4, described below, portions of the first dielectric material layer 224A may be disposed only on lower surfaces of the cavity dividers 230 (e.g. support features 230) and the perimeter sidewall 232. Beneficially, directly bonding the cold plate 206 to the semiconductor device 204, as described above, reduces the thermal resistance therebetween and increases the efficiency of heat transfer from the semiconductor device 204 to the cold plate 206. In particular, thermal resistance is reduced by directly bonding lower surfaces of the cavity dividers 230 facing the semiconductor device 204 to the backside 220 of the semiconductor device 204.

FIG. 4 is a schematic sectional view in the Y-Z plane of the integrated cooling assembly 203. In FIG. 4, the cold plate 206 comprises a patterned side that faces towards the semiconductor device 204 and an opposite side that faces towards the package cover 208 (not shown). The patterned side comprises a coolant chamber volume having plural coolant channels 210, which extend laterally between the inlet and outlet openings of the cold plate 206. Each coolant channel 210 comprises cavity sidewalls that define a corresponding coolant channel 210. Portions of the cold plate 206 between the cavity sidewalls form the support features 230 (e.g., cavity dividers 230). The support features 230 (e.g., cavity dividers 230) provide structural support to the integrated cooling assembly 203 and disrupt laminar fluid flow at the interface of the coolant and the device backside 220, resulting in increased heat transfer therebetween. Furthermore, by introducing plural coolant channels 210 to define separate coolant flow paths, an internal surface area of the cold plate 206 is increased, which further increases the efficiency of heat transfer.

In FIG. 4, arrows 228A and 228B illustrate two different heat transfer paths in the integrated cooling assembly 203. A first heat transfer path illustrated by arrow 228B shows heat generated by the semiconductor device 204 transferring directly from the semiconductor material of the semiconductor device 204 to coolant fluid flowing through the cold plate 206. A second heat transfer path illustrated by arrows 228A shows heat generated by the semiconductor device 204 being transferred from semiconductor material (e.g., silicon material) of the semiconductor device 204 to semiconductor material (e.g., silicon material) of the cold plate 206 structure, propagated throughout the semiconductor material of the cold plate 206 structure (shown as dashed lines), and being transferring into coolant fluid flowing through the cold plate 206. A thermal resistance of the first and second heat transfer paths 228A, 228B is illustrated by heat transfer path 228C, which is shown as thermal resistance R1 between a heat source and a cold plate. Here, R1 is the thermal resistance of the bulk semiconductor material of the semiconductor device 204. It can be seen that the heat transfer path 228C of the integrated cooling assembly 203 is reduced compared to the heat transfer path 26 of the device package 10 of FIG. 1, due to the direct bonding discussed above.

In some embodiments, the cold plate 206 may be attached to the semiconductor device 204 using a hybrid bonding technique, where bonds are formed between the dielectric material layers 224A, 224B (see FIG. 3) and between metal features, such as between first metal pads and second metal pads, disposed in the dielectric material layers 224A, 224B.

Suitable dielectrics that may be used as the dielectric material layers 224A, 224B include silicon oxides, silicon nitrides, silicon oxynitrides, silicon carbon nitrides, metal-oxides, metal-nitrides, silicon carbide, silicon oxycarbides, silicon oxycarbonitride, diamond-like carbon (DLC), or combinations thereof. In some embodiments, one or both of the dielectric material layers 224A, 224B are formed of an inorganic dielectric material (e.g., a dielectric material substantially free of organic polymers). Typically, one or both of the dielectric layers are deposited to a thickness greater than the thickness of a native oxide, such as about 1 nanometer (nm) or more, 5 nm or more, 10 nm or more, 50 nm or more, or 100 nm or more. In some embodiments, one or both of the layers are deposited to a thickness of 3 micrometers or less, 1 micrometer or less, 500 nm or less, such as 100 nm or less, or 50 nm or less. The dielectric layer material and thickness may be optimized for lower thermal resistance between the die and the cold plate.

The cold plate 206 may be formed of any suitable material that has sufficient structural strength to withstand the desired pressures of coolant flowing into the coolant chamber volume 210. For example, the cold plate 206 may be formed of semiconductor material like silicon or other engineered materials like glass. In other examples, the cold plate 206 may be formed of a material selected from a group comprising polymers, metals, ceramics, or composites thereof. In some embodiments, the cold plate 206 may be formed of stainless steel (e.g., from a stainless steel metal sheet) or a sapphire plate.

In some embodiments, the cold plate 206 may be formed of a bulk material having a substantially similar coefficient of linear thermal expansion (CTE) to the bulk material of the substrate 202 and/or the semiconductor device 204, where the CTE is a fractional change in length of the material (in the X-Y plane) per degree of temperature change. In some embodiments, the CTEs of the cold plate 206, the substrate 202, and/or the semiconductor device 204 are matched so that the CTE of the substrate 204 and/or the semiconductor device 204 is within about +/−20% or less of the CTE of the cold plate 206, such as within +/−15% or less, within +/−10% or less, or within about +/−5% or less when measured across a desired temperature range. In some embodiments, the CTEs are matched across a temperature range from about −60° C. to about 100° C. or from about −60° C. to about 175° C. In one example embodiment, the matched CTE materials each include silicon.

In some embodiments, the cold plate 206 may be formed of a material having a substantially different CTE from the semiconductor device 204 (e.g., a CTE mismatched material). In such embodiments, the cold plate 206 may be attached to the semiconductor device 204 by a compliant adhesive layer (not shown) or a molding material that absorbs the difference in expansion between the cold plate 206 and the semiconductor device 204 across repeated thermal cycles.

The package cover 208 shown in FIGS. 2C and 3 generally comprises one or more vertical or sloped sidewall portions 208A and a lateral portion 208B that spans and connects the sidewall portions 208A. The sidewall portions 208A may extend upwardly from a peripheral surface of the package substrate 202 to surround the device 204 and the cold plate 206 disposed thereon. The lateral portion 208B may be disposed over the cold plate 206 and is typically spaced apart from the cold plate 206 by a gap corresponding to the thickness of the sealing material layer 222. Coolant is circulated through the coolant chamber volume 210 through the inlet and outlet openings 212 of the package cover 208 formed through the lateral portion 208B. The inlet and outlet openings 206A of the cold plate 206 may be in fluid communication with the inlet and outlet openings 212 of the package cover 208 through the inlet and outlet openings 222A formed in the sealing material layer 222 disposed therebetween. In certain embodiments, coolant lines 108 (FIGS. 2A-2B) may be attached to the device package 201 by use of connector features formed in the package cover 208, such as threads formed in the sidewalls of the inlet and outlet openings 212 of the package cover 208 and/or protruding features 214 that surround the inlet and outlet openings 212 and extend upwardly from a surface of the lateral portion 208B.

Typically, the package cover 208 is formed of semi-rigid or rigid material so that at least a portion of the downward force exerted on the package cover 208 by the mounting frame is transferred to a supporting surface of the package substrate 202 and not transferred to the cold plate 206 and the semiconductor device 204 therebelow. In some embodiments, the package cover 208 is formed of a thermally conductive metal, such as aluminum or copper. In such embodiments, the package cover 208 functions as a heat spreader that redistributes heat from one or more electronic components of the semiconductor device 204. In some embodiments, the package cover 208 and/or a manifold is insulating to minimize heat flow between components (e.g., dies, die stacks, device packages, etc.). For example, the package cover 208 and/or manifold may minimize heat flow between a first die and a second die. In another example, the package cover 208 and/or manifold may minimize heat flow between a first die stack and a second die stack. In another example, the package cover 208 and/or manifold may minimize heat flow between a first device package and a second device package. In another example, the package cover 208 and/or manifold may minimize heat flow between a first die and a first die stack. In another example, the package cover 208 and/or manifold may minimize heat flow between a first die of a first device package and a second device package.

It should be noted that the direction in which the coolant fluid flows through the cold plate 206 may be controlled depending on the relative locations of the inlet and outlet openings. For example, the coolant fluid may flow from left to right in the device package 201 of FIG. 3 when the inlet openings 212, 222A, 206A of the package cover 208, the sealing material layer 222, and the cold plate 206, respectively, are located on the left-hand side of the device package 201 and the outlet openings 212, 222A, 206A of the package cover 208, the sealing material layer 222, and the cold plate 206, respectively, are located on the right-hand side of the device package 201. Alternatively, the coolant fluid may flow from right to left in the device package 201 illustrated in FIG. 3 when the outlet openings 212, 222A, 206A of the package cover 208, the sealing material layer 222, and the cold plate 206 are located on the left-hand side of the device package 201 and the inlet openings 212, 222A, 206A of the package cover 208, the sealing material layer 222, and the cold plate 206 are located on the right-hand side of the device package 201. Although only one set of inlet and outlet openings is shown and described here, additional inlet and outlet openings may also be provided at various locations on the package cover 208, the sealing material layer 222, and the cold plate 206.

An example flow path of the coolant fluid through the coolant chamber volume 210 may be as follows:

1. Coolant fluid enters the coolant chamber volume 210 through the inlet openings.

2. Coolant fluid flows across the inside surfaces of the cold plate 206 and absorbs heat generated by the semiconductor device 204, which has dissipated into the cold plate 206 structure. The coolant fluid may also flow directly across the backside 220 of the semiconductor device 204 to absorb heat energy directly from the semiconductor device 204. The coolant chamber volume 210 may additionally have various channels formed to direct the coolant fluid flow from inlet opening(s) to outlet opening(s) and facilitate heat extraction from the semiconductor device 204 by the coolant fluid. In some embodiments, the coolant fluid may be in direct contact with the backside 220 of the semiconductor device 204 or via one or more substrate or layers between the coolant fluid or backside 220 of the semiconductor device 204.

3. Coolant fluid exits the coolant chamber volume 210 through outlet openings.

It will be understood from the above flow path that heat is extracted without introducing an unnecessary thermal resistance (e.g., a TIM disposed between the backside 220 of the semiconductor device 204 and the cold plate 206) between the backside 220 of the semiconductor device 204 and the cold plate 206.

Figure 5:
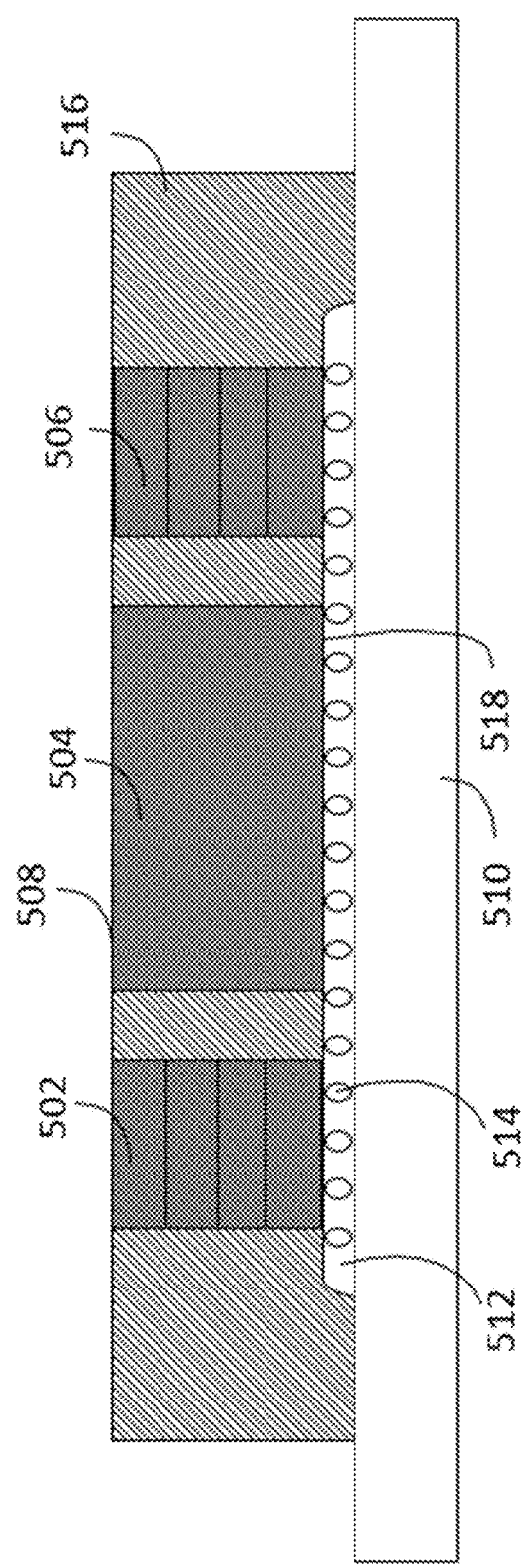
FIG. 5 is a schematic partial sectional side view showing a step of a process for manufacturing the multi-component device package described herein, in accordance with some embodiments of the present disclosure.

FIG. 5 is a schematic partial sectional side view showing a step of a process for manufacturing the multi-component device package described herein, in accordance with some embodiments of the present disclosure. FIG. 5 displays a first semiconductor device 502, a second semiconductor device 504, and a third semiconductor device 506. One or more of the semiconductor devices may be singulated and/or disposed in a vertical device stack (e.g., the first semiconductor device 502, and the third semiconductor device 506). In some embodiments, the first semiconductor device 502 and/or the third semiconductor device 506 are memory devices (e.g., HBM) and the second semiconductor device is a processor device (e.g., CPU). Here, the semiconductor devices are disposed in a side-by-side arrangement on the underfill layer 512 and are in electrical communication with one another through conductive elements formed in, on, or through an underfill layer 512. In some embodiments, the first semiconductor device 502, the second semiconductor device 504, and/or the third semiconductor device 506 are the same or similar to the semiconductor devices described in FIG. 3.

In some embodiments, one or more of the semiconductor devices include an active side (e.g., first active side 518) and a non-active side (e.g., first non-active side 508) as described herein. One or more active sides (e.g., first active side 518) may be positioned adjacent to and facing towards a first wafer 510. In some embodiments, one or more active sides (e.g., first active side 518) are temporarily bonded to the first wafer 510 before or after a thinning process. In some embodiments, the first wafer 510 is a carrier/dummy wafer or interposer wafer and provides support and/or facilitates handling during one or more steps of the process described herein. In some embodiments, the underfill layer 512 may be disposed between the one or more active sides (e.g., first active side 518) and the first wafer 510. The underfill layer 512 may encapsulate conductive bumps 514 disposed between one or more semiconductor devices (e.g., first semiconductor device 502, the second semiconductor device 504, and/or the third semiconductor device 506) and the first wafer 510. In some embodiments, a mold material 516 encapsulates the first semiconductor device 502, the second semiconductor device 504, and/or the third semiconductor device 506.

In some embodiments, the first semiconductor device 502, the second semiconductor device 504, the third semiconductor device 506, the underfill layer 512, the conductive bumps 514, and the mold material 516 are part of a packaged module (e.g., TPU 1800). For example, the mold material 516 may be disposed on an interposer layer 1808. In such embodiments, the first wafer 510 may not be necessary. However, the same or similar methodologies described in FIGS. 5-8 may be used for the packaged module.

Figure 6:
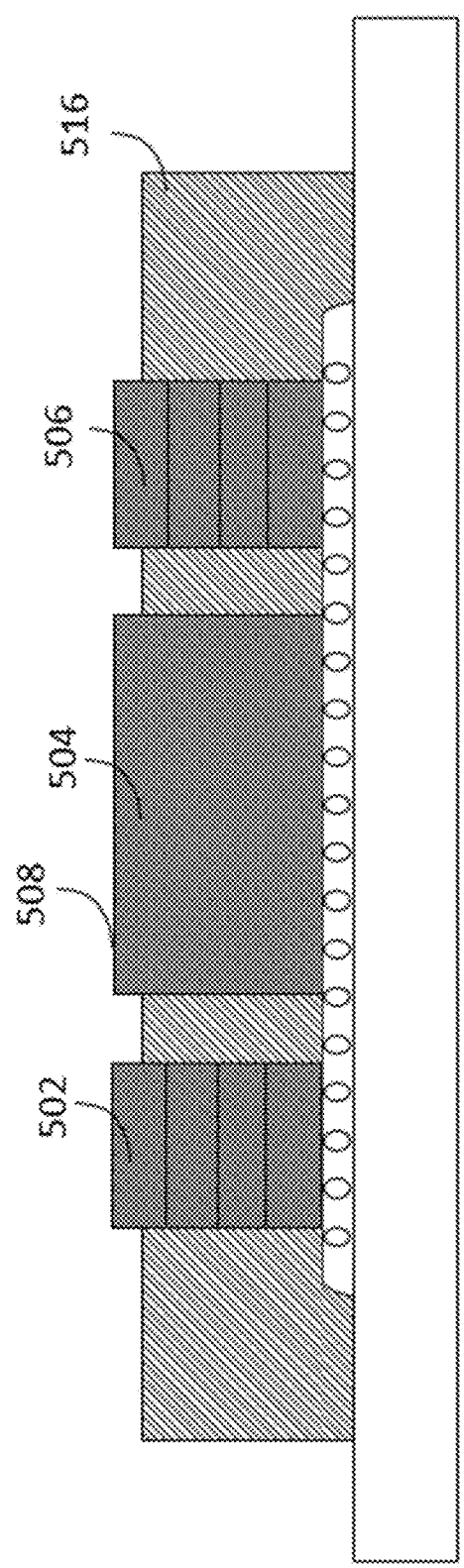
FIG. 6 is a schematic partial sectional side view showing another step of a process for manufacturing the multi-component device package described herein, in accordance with some embodiments of the present disclosure.

FIG. 6 is a schematic partial sectional side view showing a step of a process for manufacturing the multi-component device package described herein, in accordance with some embodiments of the present disclosure. In FIG. 6, a portion of the mold material 516 has been removed to expose portions of the semiconductor devices. In some embodiments, the mold material 516 is recessed below an upper surface of one or more of the semiconductor devices. For example, the mold material 516 may be recessed below the first non-active side 508 of the second semiconductor device 504. The mold material 516 may be recessed a first depth (e.g., between 1-5 microns, between 5-10 microns, between 5-20 microns, etc.) below an upper surface of the one or more semiconductor devices.

The mold material 516 may have significantly different physical properties compared to the upper surfaces (e.g., first non-active side 508) of the one or more semiconductor devices. Accordingly, certain removal methods may damage the upper surfaces of the one or more semiconductor devices. In some embodiments, the portion of the mold material 516 is removed using a physical etch and/or a chemical etch.

In some embodiments, one or more exposed surfaces of the semiconductor devices are polished to a desired smoothness using a chemical mechanical polishing (CMP) process or similar such smoothing process. CMP may result in removing surface irregularities from one or more exposed surfaces of the semiconductor devices.

Figure 7:
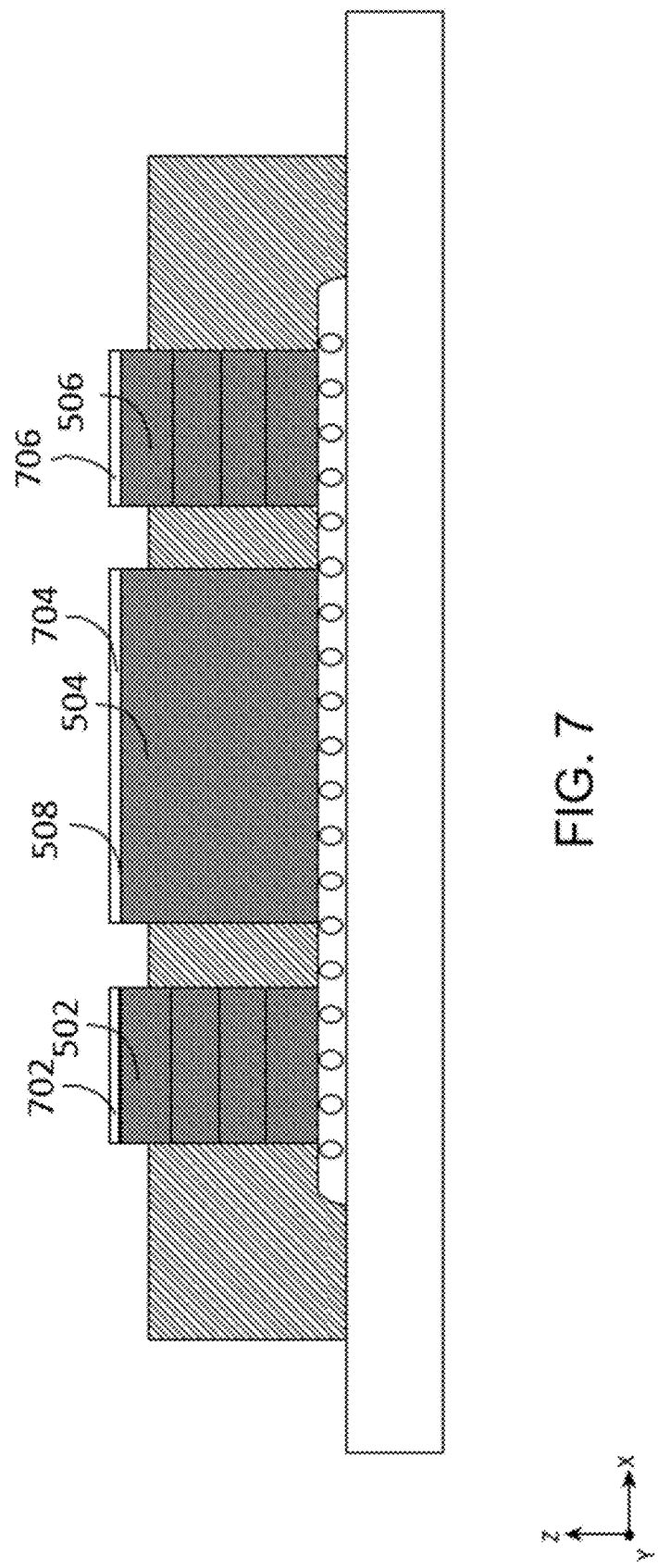
FIG. 7 is a schematic partial sectional side view showing another step of a process for manufacturing the multi-component device package described herein, in accordance with some embodiments of the present disclosure.

FIG. 7 is a schematic partial sectional side view showing a step of a process for manufacturing the multi-component device package described herein, in accordance with some embodiments of the present disclosure. In FIG. 7, native oxides have been formed on one or more surfaces of the semiconductor devices. For example, a first native oxide layer 702 is formed on the upper surface of the first semiconductor device 502, a second native oxide layer 704 is formed on the upper surface of the second semiconductor device 504, and a third native oxide layer 706 is formed on the upper surface of the third semiconductor device 506. In some embodiments, one or more native oxide layers are formed using a wet chemical treatment. For example, the one or more native oxide layers may be formed using a piranha etch (also known as piranha solution), an oxygen ($O_2$) activation process, a nitrogen ($N_2$) activation process, a hydrogen peroxide ($H_2O_2$) treatment, and/or similar such wet chemical treatments. In some embodiments, the $O_2$ activation process and/or the $N_2$ activation process occur at elevated temperatures and may be referred to as a hot $O_2$ activation process and/or a hot $N_2$ activation process. The hot $O_2$ activation process and/or the hot $N_2$ activation process may occur at temperatures ranging between 50 degrees Celsius and 300 degrees Celsius. In some embodiments, experiments where the activation process occurs at 175 degrees Celsius has resulted in strong bonds.

In some embodiments, after the one of more native oxide layers are formed, upper surfaces of the semiconductor devices (e.g., comprising the native oxide layers) are prepared for bonding. For example, the upper surfaces of the semiconductor devices are prepared for direct bonding.

Preparing the upper surfaces may include smoothing the respective upper surfaces to a desired surface roughness, such as between 0.1 to 3.0 nm root mean square (RMS), activating the upper surfaces to weaken or open chemical bonds in the upper surfaces, and terminating the upper surfaces with a desired species. Smoothing the upper surfaces may include polishing the upper surfaces using a CMP process. Activating and terminating the upper surfaces with a desired species may include exposing the upper surfaces to radical species formed in a plasma. The bond interface between the bonded surfaces can include a higher concentration of materials from the activation and/or last chemical treatment processes compared to the bulk of the bonding layers. For example, in some embodiments that utilize a nitrogen plasma for activation, a nitrogen concentration peak can be formed at the bond interface. In some embodiments, the nitrogen concentration peak may be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with NH2 molecules, yielding a nitrogen-terminated surface. In embodiments that utilize an oxygen plasma for activation, an oxygen concentration peak can be formed at the bond interface between non-conductive bonding surfaces.

In some embodiments, the plasma is formed using a nitrogen-containing gas (e.g., N2) and the terminating species includes nitrogen, or nitrogen and hydrogen. In some embodiments, fluorine may also be present within the plasma. In some embodiments, the upper surfaces may be activated using a wet cleaning process (e.g., by exposing the surfaces to an aqueous ammonia solution).

Figure 8:
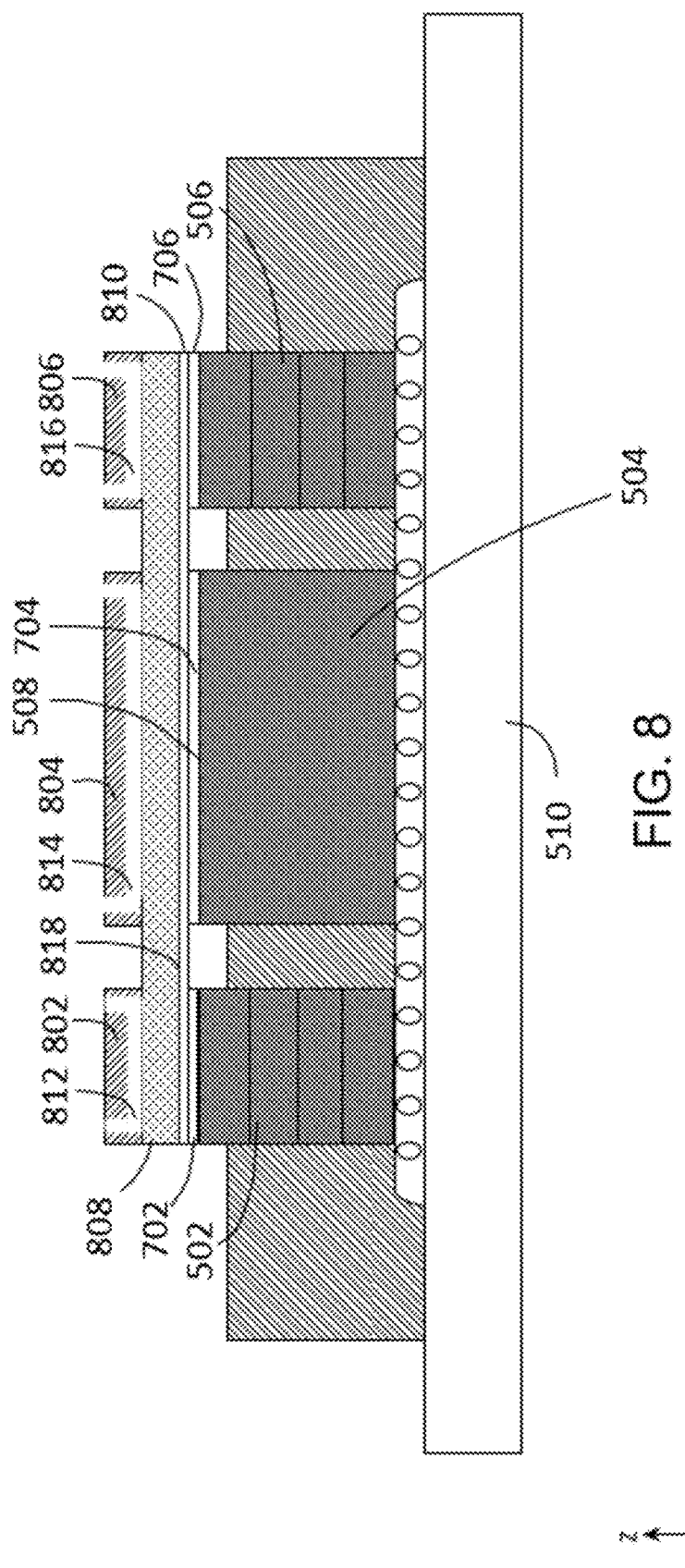
FIG. 8 is a schematic partial sectional side view showing another step of a process for manufacturing the multi-component device package described herein, in accordance with some embodiments of the present disclosure.

FIG. 8 is a schematic partial sectional side view showing a step of a process for manufacturing the multi-component device package described herein, in accordance with some embodiments of the present disclosure. In FIG. 8, one or more cold plates are bonded to the semiconductor devices. In some embodiments, a first cold plate 802, a second cold plate 804, and a third cold plate 806 are attached to a base plate 808, which is then bonded to the semiconductor devices. The base plate 808 may be disposed between the semiconductor devices and the one or more cold plates to prevent coolant flowing through the one or more cooling plates from directly contacting the semiconductor devices. The base plate 808 may be made of a silicon material. In some embodiments, the base plate 808 provides a more uniform heat transfer area and/or provides structural integrity for the packaging. In some embodiments, the thickness of the base plate 808 is between 50 micrometers and 700 micrometers. In some embodiments, the thickness of the base plate 808 is between 50 micrometers and 300 micrometers.

Figure 13:
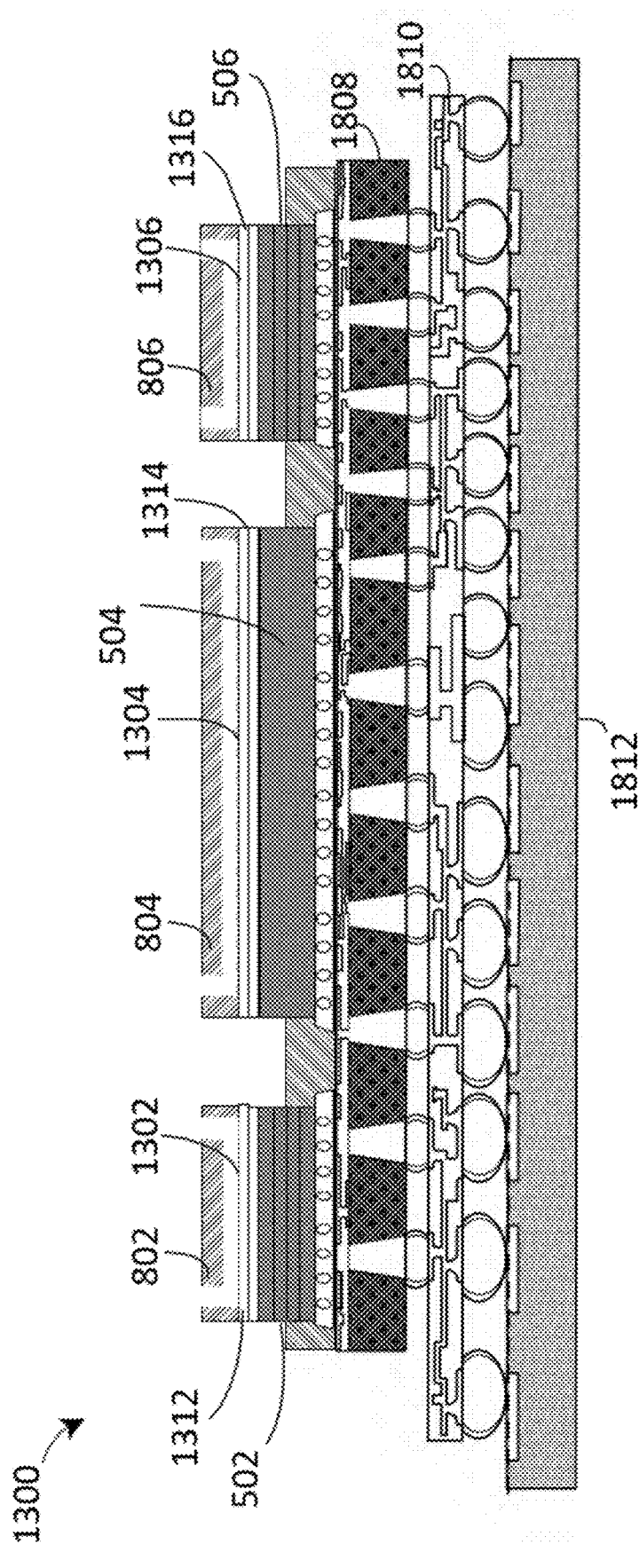
FIG. 13 is a schematic sectional view of an additional integrated cooling assembly design, in accordance with embodiments of the present disclosure.

In some embodiments, one or more cold plates are bonded to the semiconductor devices without the base plate 808 disposed between the one or more cold plates and the semiconductor devices (e.g., FIG. 13). For example, the first cold plate 802 may be bonded to the first semiconductor device 502, the second cold plate 804 may be bonded to the second semiconductor device 504, and the third cold plate 806 may be bonded to the third semiconductor device 506 without the base plate 808 therebetween. In some embodiments, a lower surface 818 of the base plate 808 is prepared for bonding using any of the methodologies described herein. For example, an oxide layer 810 may be deposited on the lower surface 818 of the base plate 808 prior to bonding. In some embodiments, each cold plate is bonded to separate base plates. For example, the first cold plate 802 may be bonded to a first base plate and the first base plate is bonded to the first semiconductor device 502. The second cold plate 804 may be bonded to a second base plate and the second base plate is bonded to the second semiconductor device 504. The third cold plate 806 may be bonded to a third base plate and the third base plate is bonded to the third semiconductor device 506.

The cold plates may comprise one or more coolant channels. For example, the first cold plate 802 may comprise a first coolant channel 812, the second cold plate 804 may comprise a second coolant channel 814, and the third cold plate 806 may comprise a third coolant channel 816. Although only one coolant channel is described for each cold plate, one or more cold plates may have more than one coolant channel. For example, the first cold plate 802 may comprise a first coolant channel 812 and one or more additional coolant channels. The coolant channels of FIG. 8 may be the same or similar to coolant channels (e.g., coolant channels 210) described herein. In some embodiments, each coolant channel is coupled to a different coolant line (e.g., coolant line 108). For example, the first coolant channel 812 may be coupled to a first coolant line, the second coolant channel 814 may be coupled to a second coolant line, and the third coolant channel 816 may be coupled to a third coolant line.

In some embodiments, bonding one or more cold plates to the semiconductor devices comprises bonding a first substrate comprising the one or more cold plates to a second substrate comprising one or more semiconductor devices, and then singulating one or more integrated cooling assemblies from the bonded first and second substrates. For example, a second wafer (bare or reconstituted wafer) comprising one or more cold plates can be directly bonded to the first wafer 510 comprising the semiconductor devices.

It will be understood that the first substrate may be a cold plate die or part of a wafer of cold plates. Further, the second substrate may be a semiconductor device die or part of a wafer of semiconductor devices. Therefore, the bonding may include die-to-die direct bonding (e.g., cold plate die to semiconductor device die), wafer-to-die direct bonding (e.g., cold plate die to semiconductor device wafer, or cold plate wafer to semiconductor device die), and wafer-to-wafer direct bonding (e.g., cold plate wafer to semiconductor device wafer). It will be understood that the singulation step (discussed in relation to block 64, below) may not be required for a die-to-die direct bonding operation.

The following description is focused on forming one integrated cooling assembly comprising multiple cold plates and multiple semiconductor device. However, as mentioned herein, in some embodiments, the first substrate may comprise a single cold plate. In some embodiments, the first substrate (e.g., a monocrystalline silicon wafer) comprising one or more cold plates is directly bonded to the second substrate (e.g., a monocrystalline silicon wafer) comprising a multiple semiconductor devices without an intervening adhesive.

In some embodiments, the first substrate may be etched using a patterned mask layer formed on its surface to form features of the one or more cold plates An anisotropic etch process may be used, which uses inherently differing etch rates for the silicon material as between plane surfaces and plane surfaces when exposed to an anisotropic etchant. In some embodiments, the etching process is controlled to where the etch rates of the substrate surfaces have a ratio between about 1:10 and about 1:200, such as between about 1:10 and about 1:100, for example between about 1:10 and 1:50, or between about 1:25 and 1:75. Examples of suitable anisotropic wet etchants include aqueous solutions of potassium hydroxide (KOH), ethylene diamine and pyrocatechol (EPD), ammonium hydroxide (HN4OH), hydrazine (N2H4), or tetra methyl ammonium hydroxide (TMAH). The actual etch rates of the silicon substrate depend on the concentration of the etchant in the aqueous solution, the temperature of the aqueous solution, and a concentration of the dopant in the substrate (if any). Typically, the mask layer is formed of a material that is selective to anisotropic etch compared to the underlying monocrystalline silicon substrate. Examples of suitable mask materials include silicon oxide ($Si_xO_y$) or silicon nitride ($Si_xN_y$). In some embodiments, the mask layer has a thickness of about 100 nm or less, such as about 50 nm or less, or about 30 nm or less. The mask layer may be patterned using any suitable combination of lithography and material etching patterning methods.

Directly forming direct dielectric bonds between the first and second substrates may include bringing the prepared and aligned surfaces into direct contact at a temperature less than 150° C., such as less than 100° C., for example, less than 30° C., or about room temperature (e.g., between 20° C. and 30° C.). Without intending to be bound by theory, in the case of directly bonding surfaces terminated with nitrogen and hydrogen (e.g., $NH_2$ groups), it is believed that the hydrogen terminating species diffuse from the interfacial bonding surfaces, and chemical bonds are formed between the remaining nitrogen species during the direct bonding process. In some embodiments, the direct bond is strengthened using an anneal process, where the substrates are heated to and maintained at a temperature of greater than about 30° C. and less than about 450° C., for example, greater than about 50° C. and less than about 250° C., or about 150° C., for a duration of about 5 minutes or more, such as about 15 minutes. Typically, the bonds will strengthen over time even without the application of heat. Thus, in some embodiments, the method does not include heating the substrates.

In some embodiments, forming dielectric layers on one or both the first and second substrates, and directly bonding includes forming dielectric bonds between a first dielectric material layer of the first substrate and a second dielectric material layer of the second substrate (or forming dielectric bonds between one substrate and a dielectric material layer of the other substrate). The direct bonding process may join dielectric layers by forming strong chemical bonds (e.g., covalent bonds) between the dielectric layers. In some embodiments, the dielectric bonds may be formed using a dielectric material layer deposited on only one of the first and second substrates, but not on both. In those embodiments, the direct dielectric bonds may be formed by contacting the deposited dielectric material layer of one of the first and second substrates directly with a bulk material surface (or such a surface with a native oxide) of the other substrate.

In embodiments where the first and second substrates are bonded using hybrid dielectric and metal bonds, planarizing or recessing may be performed. For example, planarizing or recessing the metal features below the dielectric field surface before contacting and bonding the dielectric material layers may be performed. After the dielectric bonds are formed, the first and second substrates may be heated to a temperature of 150° C. or more and maintained at the elevated temperature for a duration of about 1 hour or more, such as between 8 and 24 hours, to form direct metallurgical bonds between the metal features. Suitable direct dielectric and hybrid bonding technologies that may be used to perform aspects of the methods described herein include ZiBond® and DBI®, each of which are commercially available from Adeia Holding Corp., San Jose, CA, USA.

In some embodiments, a TIM may be used instead of direct bonding and/or in addition to direct bonding. A TIM may be any material used to improve heat transfer and dissipation in semiconductor devices and can be placed between a heat-generating component or chip and a heat-dissipating device or substrate. In some embodiments, TIMs help with thermal management by acting as gap fillers between two solid mating surfaces.

Figure 9:
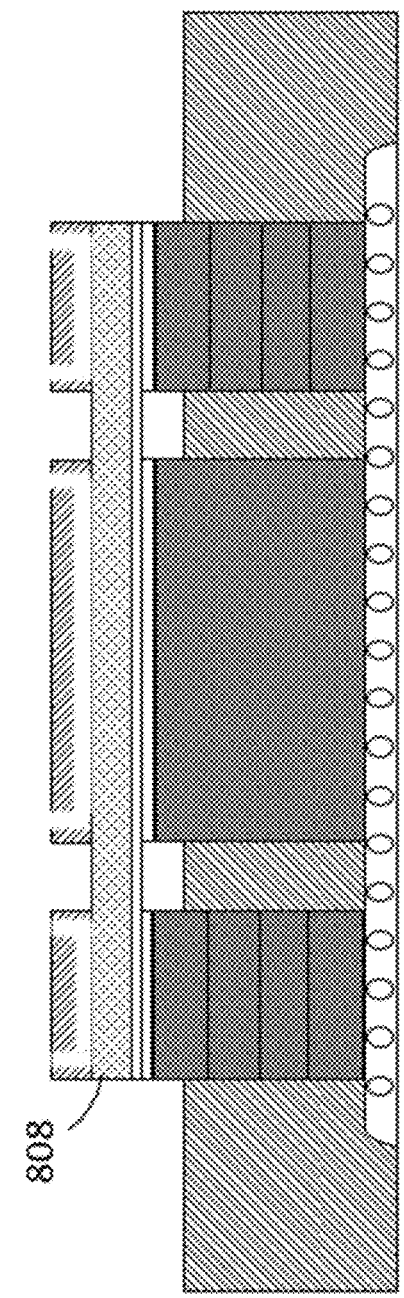
FIG. 9 is a schematic partial sectional side view showing another step of a process for manufacturing the multi-component device package described herein, in accordance with some embodiments of the present disclosure.

FIG. 9 is a schematic partial sectional side view showing a step of a process for manufacturing the multi-component device package described herein, in accordance with some embodiments of the present disclosure. In FIG. 9, the wafer 510 has been removed from the integrated cooling assembly 910.

In some embodiments, the integrated cooling assembly 910 is ready to be secured to a PCB board (e.g., PCB board 102) after the wafer 510 has been removed. In some embodiments, the integrated cooling assembly 910 is singulated from the bonded first and/or second substrates. Singulation after bonding may impart distinctive structural characteristics on the integrated cooling assembly 910 as the bonding surface of the base plate 808 has the same or similar perimeter as the combined upper surfaces of the semiconductor devices bonded thereto. Thus, the sidewalls (e.g., side surfaces) of the base plate cold plate 808 may be flush with the edges (e.g., side surfaces) of the semiconductor devices about their common perimeters.

In some embodiments, the integrated cooling assembly 501 is connected to a package substrate (e.g., package substrate 202) and sealing a package cover (e.g., package cover 208) comprising inlet and outlet openings (e.g., inlet and outlet openings 212) by use of a molding compound that, when cured, forms a sealing material (e.g., sealing material layer 222). In some embodiments, before or after sealing a package cover 208 to the integrated cooling assembly 910, inlet and outlet openings 222A are formed in the sealing material layer 222 to fluidly connect the inlet and outlet openings 212 of the package cover 208 to the one or more cold plates of the integrated cooling assembly 910.

Figure 10:
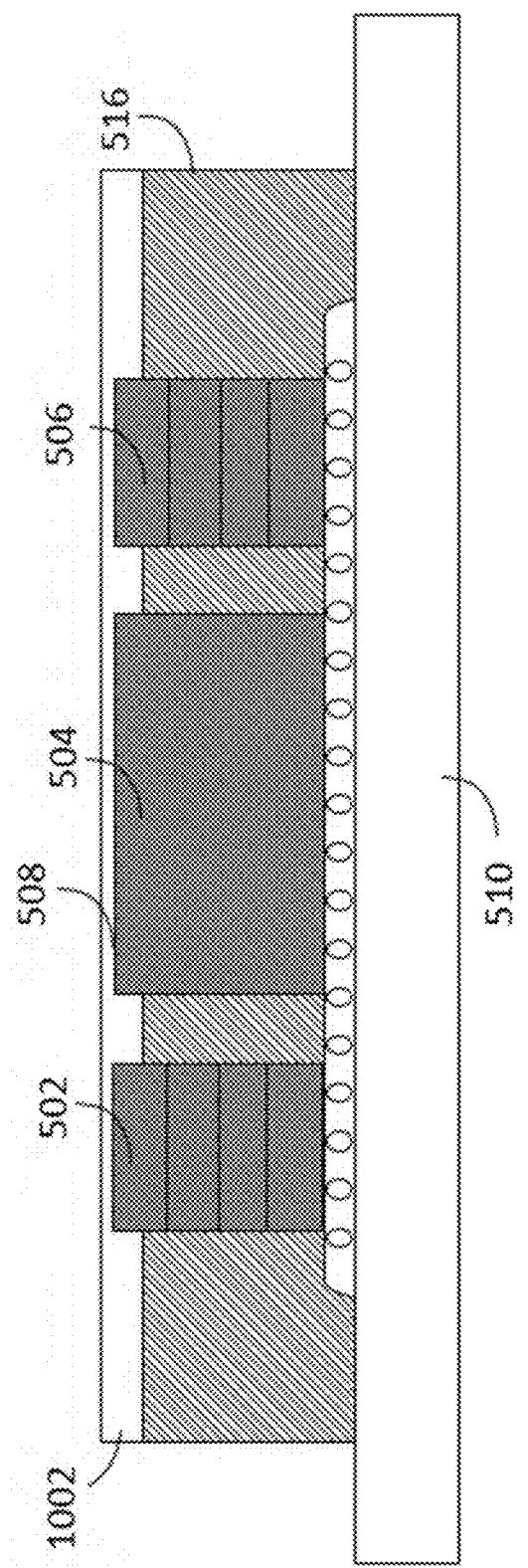
FIG. 10 is a schematic partial sectional side view showing another step of a process for manufacturing the multi-component device package described herein, in accordance with some embodiments of the present disclosure.

FIG. 10 is a schematic partial sectional side view showing a step of a process for manufacturing the multi-component device package described herein, in accordance with some embodiments of the present disclosure. FIG. 10 shows an oxide layer 1002 being deposited on one or more semiconductor devices and molding material. For example, the oxide layer 1002 may be disposed on the first semiconductor device 502, the second semiconductor device 504, the third semiconductor device 506, and the molding material 516. In some embodiments, FIG. 10 displays the same or similar devices described in FIG. 5 above.

In some embodiments, the first semiconductor device 502, the second semiconductor device 504, the third semiconductor device 506, the underfill layer, the conductive bumps, and the mold material 516 are part of a packaged module (e.g., TPU 1800). For example, the mold material 516 may be disposed on an interposer layer 1808. In such embodiments, the first wafer 510 may not be necessary. However, the same or similar methodologies described in FIGS. 10-11 may be used for the packaged module.

In some embodiments, the oxide layer 1002 is deposited using Silox vapor phase oxidation or chemical vapor deposition with Thetraethyl Orthosilicate (TEOS)) reactants. In some embodiments, the oxide layer 1002 deposition process uses dielectric materials such as $SiO_x$ (e.g., $SiO_2$), $SiN_y$ (e.g., $Si_3N_4$), $SiO_xN_y$, and/or $Si_xO_yN_z$. In some embodiments, the oxide layer 1002 is deposited using any of the methods described herein. Formation of native oxide layers and/or deposition of oxide layers may use additional embodiments to those described herein. Formation and/or deposition of oxide layers are discussed in U.S. patent application Ser. No. 18/393,016, the entirety of which is hereby incorporated by reference herein.

In some embodiments, after the oxide layer 1002 is deposited, upper surfaces of the semiconductor devices (e.g., comprising the native oxide layers) are prepared for bonding. For example, the upper surfaces of the semiconductor devices are prepared for direct bonding.

Preparing the upper surfaces may include smoothing the respective upper surfaces to a desired surface roughness, such as between 0.1 to 3.0 nm RMS, activating the upper surfaces to weaken or open chemical bonds in the upper surfaces, and terminating the upper surfaces with a desired species. Smoothing the upper surfaces may include polishing the upper surfaces using a CMP process. Activating and terminating the upper surfaces with a desired species may include exposing the upper surfaces to radical species formed in a plasma. The bond interface between the bonded surfaces can include a higher concentration of materials from the activation and/or last chemical treatment processes compared to the bulk of the bonding layers. For example, in some embodiments that utilize a nitrogen plasma for activation, a nitrogen concentration peak can be formed at the bond interface. In embodiments that utilize an oxygen plasma for activation, an oxygen concentration peak can be formed at the bond interface between non-conductive bonding surfaces.

In some embodiments, the plasma is formed using a nitrogen-containing gas (e.g., N2) and the terminating species includes nitrogen, or nitrogen and hydrogen. In some embodiments, fluorine may also be present within the plasma. In some embodiments, the upper surfaces may be activated using a wet cleaning process (e.g., by exposing the surfaces to an aqueous ammonia solution).

Figure 11:
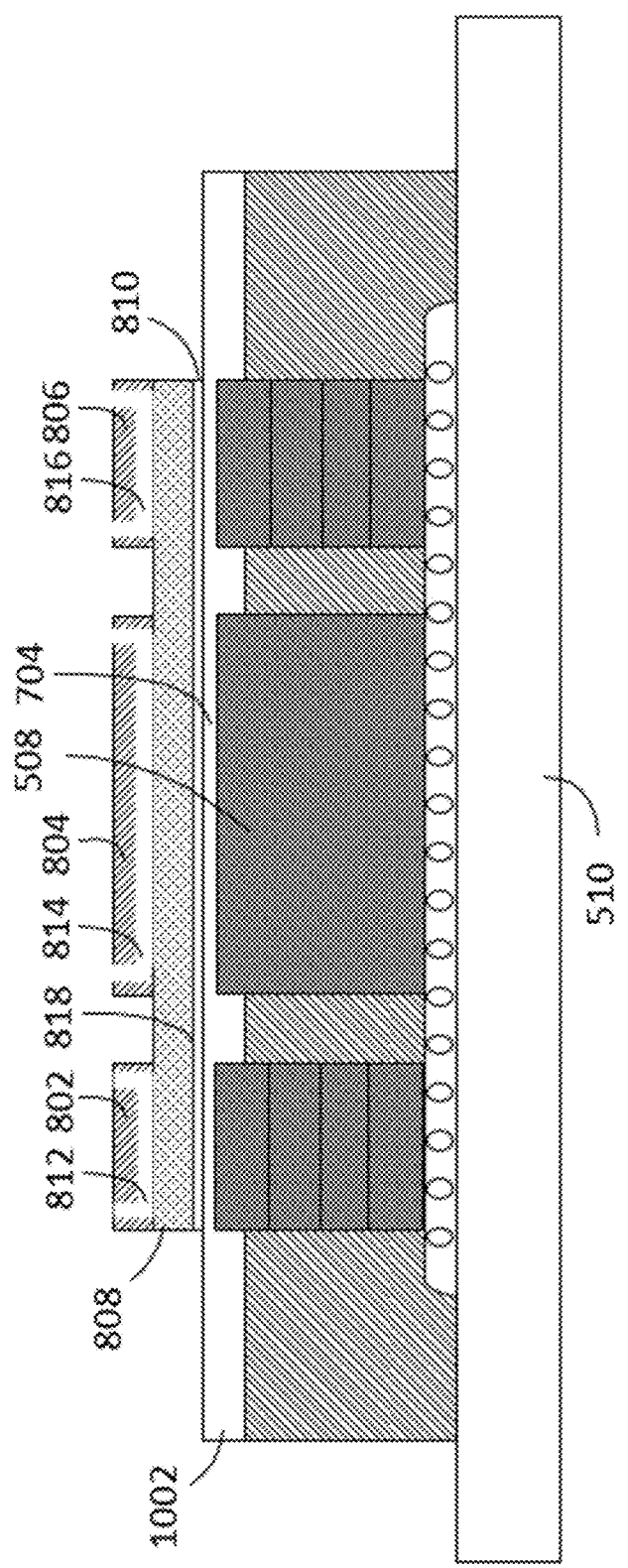
FIG. 11 is a schematic partial sectional side view showing another step of a process for manufacturing the multi-component device package described herein, in accordance with some embodiments of the present disclosure.

FIG. 11 is a schematic partial sectional side view showing a step of a process for manufacturing the multi-component device package described herein, in accordance with some embodiments of the present disclosure. In FIG. 11, one or more cold plates are bonded to the semiconductor devices. In some embodiments, FIG. 11 displays the same or similar components described in FIG. 7 above. For example, the first cold plate 802, the second cold plate 804, and the third cold plate 806 are attached to a base plate 808, which is then bonded to the semiconductor devices. In some embodiments, the bonding process and surface preparation processes used to bond the one or more cold plates with the semiconductor devices are the same or similar to those described above.

Figure 12:
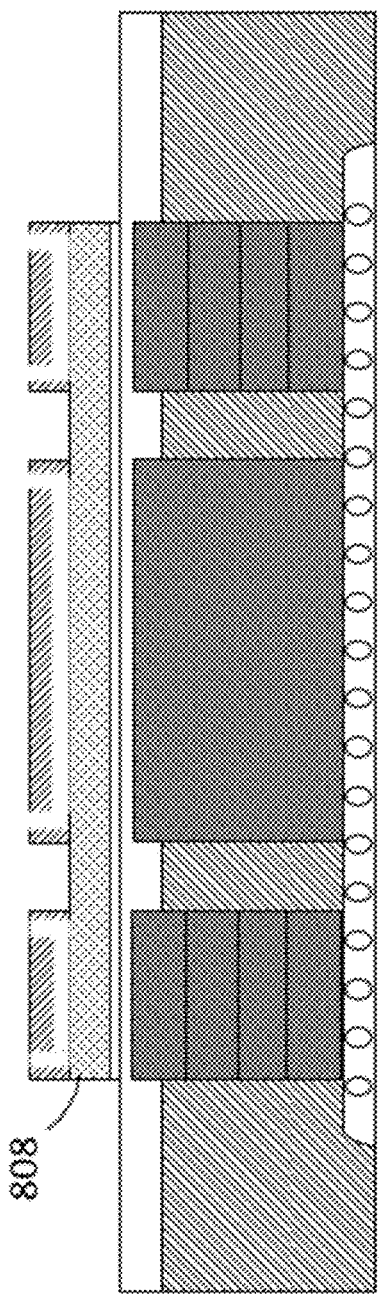
FIG. 12 is a schematic partial sectional side view showing another step of a process for manufacturing the multi-component device package described herein, in accordance with some embodiments of the present disclosure.

FIG. 12 is a schematic partial sectional side view showing a step of a process for manufacturing the multi-component device package described herein, in accordance with some embodiments of the present disclosure. In FIG. 12, the wafer 510 has been removed from the integrated cooling assembly 1210. In some embodiments, FIG. 12 displays the same or similar components described in FIG. 9 above.

In some embodiments, the integrated cooling assembly 1210 is ready to be secured to a PCB board (e.g., PCB board 102) after the wafer 510 has been removed. In some embodiments, the integrated cooling assembly 1210 is singulated from the bonded first and/or second substrates. Singulation after bonding may impart distinctive structural characteristics on the integrated cooling assembly 1210 as the bonding surface of the base plate 808 has the same or similar perimeter as the combined upper surfaces of the semiconductor devices bonded thereto. Thus, the sidewalls (e.g., side surfaces) of the base plate 808 may be flush with the edges (e.g., side surfaces) of the semiconductor devices about their common perimeters.

In some embodiments, the integrated cooling assembly 1210 is connected to a package substrate (e.g., package substrate 202) and sealing a package cover (e.g., package cover 208) comprising inlet and outlet openings (e.g., inlet and outlet openings 212) by use of a molding compound that, when cured, forms a sealing material (e.g., sealing material layer 222). In some embodiments, before or after sealing a package cover 208 to the integrated cooling assembly 1210, forming inlet and outlet openings 222A in the sealing material layer 222 to fluidly connect the inlet and outlet openings 212 of the package cover 208 to the one or more cold plates of the integrated cooling assembly 1210.

FIG. 13 is a schematic sectional view of an additional integrated cooling assembly design, in accordance with embodiments of the present disclosure. In some embodiments, the integrated cooling assembly 1300 comprises a plurality of cold plates bonded to a plurality of semiconductor devices. For example, the first cold plate 802 may be bonded to the first semiconductor device 502, the second cold plate 804 may be bonded to the second semiconductor device 504, and the third cold plate 806 may be bonded to the third semiconductor device 506. Although cold plates directly bonded to the semiconductor devices are shown, one or more base plates may be between one or more cold plates and one or more semiconductor devices. For example, the first base plate may be between the first cold plate 802 and the first semiconductor device 502 and the a second base plate may be between the second cold plate 804 and the second semiconductor device 504. The cold plates may be attached to each of the semiconductor devices and/or to one or more base plates by the direct bonding methods described herein or other methods including flip chip bonding, etc. The one or more cold plates may comprise one or more coolant channels as described herein.

In some embodiments, one or more semiconductor devices are attached to an interposer layer 1808. The one or more semiconductors may be attached to the interposer layer 1808 by direct bonding, hybrid bonding, and/or any of the other methods described herein. For example, the first semiconductor device 502, the second semiconductor device 504, and the third semiconductor device 506 may be bonded to the interposer layer 1808 using hybrid bonding or conductive bumps. In some embodiments, the interposer layer 1808 is a silicon interposer or glass interposer. In some embodiments, the interposer layer 1808 is attached to a substrate 1810 and the substrate 1810 is attached to a PCB board 1812. For example, the interposer layer 1808 may be assembled on the substrate 1810 and the substrate 1810 may be soldered to the PCB board 1812. In some embodiments, the interposer layer 1808 carries signals from one or more semiconductor devices (e.g., first semiconductor device 502, second semiconductor device 504, third semiconductor device 506, etc.) into the substrate 1810. The signals may then pass through the substrate 1810 and into the PCB board 1812.

In some embodiments, the first cold plate 802 comprises a first lower surface 1302, the second cold plate 804 comprises a second lower surface 1304, and the third cold plate 806 comprises a third lower surface 1306. In some embodiments, the lower surfaces of the cold plates are prepared for bonding using any of the methodologies described herein. For example, one or more oxide layers may be deposited on the lower surfaces of the cold plates prior to bonding. As shown, a first oxide layer 1312 is formed on the first lower surface 1302 of the first cold plate 802, a second oxide layer 1314 is formed on the second lower surface 1304 of the second cold plate 804, and a third oxide layer 1316 is formed on the third lower surface 1306 of the third cold plate 806.

In some embodiments, one or more cold plates bonded to semiconductor devices are singulated prior to assembly to a silicon interposer. Singulation after bonding may impart distinctive structural characteristics on the integrated cooling assembly 1300 as the bonding surfaces of the cold plates have the same perimeters as the backside of the respective semiconductor devices bonded thereto. Thus, the sidewalls (e.g., side surfaces) of the cold plates may be flush with the edges (e.g., side surfaces) of the respective semiconductor devices about their respective perimeters. In some embodiments, the cold plates are singulated from a first substrate using a process that cuts or divides the first substrate in a vertical plane, i.e., in the Z-direction. In those embodiments, the side surfaces of the cold plates are substantially perpendicular to the backsides of the respective semiconductor devices, i.e., a horizontal (X-Y) plane of an attachment interface between the semiconductor devices and the respective cold plates. In some embodiments, one or more cold plates are singulated using a saw or laser dicing process.

Here, the cold plates are sized to provide a bonding surface for attachment to the semiconductor device but may otherwise be the same or substantially similar to other cold plates described herein. In some embodiments, the combined lateral dimensions (or footprint) of the cold plates may be smaller or larger than the combined lateral dimensions (or footprint) of the semiconductor devices. In some embodiments, one or more sidewalls of the cold plates may be aligned or offset to the vertical sidewalls of the semiconductor devices (including inside or outside their footprint).

Figure 14:
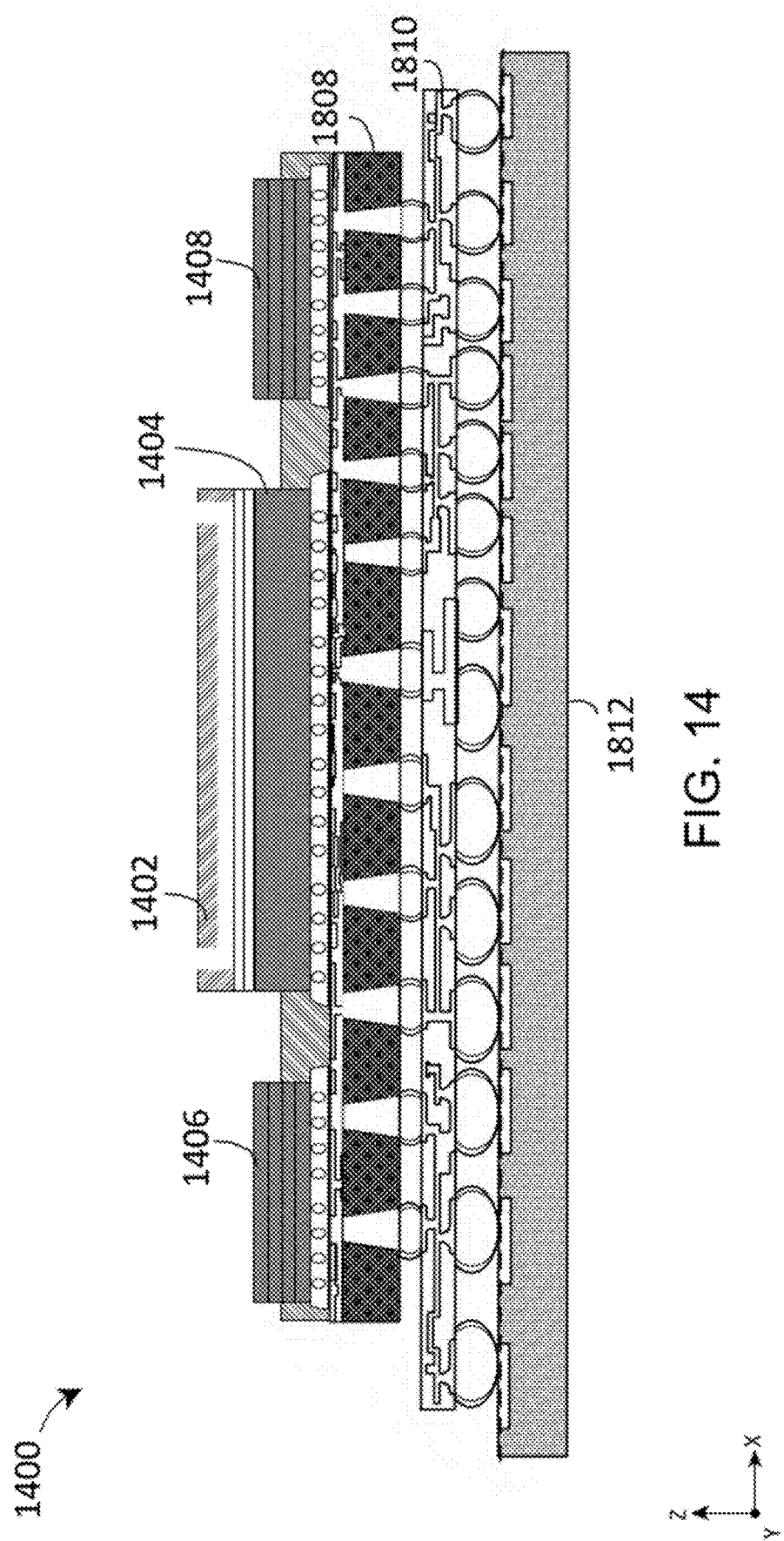
FIG. 14 is a schematic sectional view of an additional integrated cooling assembly design, in accordance with embodiments of the present disclosure.

FIG. 14 is a schematic sectional view of an additional integrated cooling assembly design, in accordance with embodiments of the present disclosure. In some embodiments, the integrated cooling assembly 1400 comprises a cold plate bonded to a single semiconductor device of the plurality of semiconductor devices. For example, a first cold plate 1402 may be bonded to the first semiconductor device 1404. The first cold plate 1402 may be attached to the first semiconductor device 1404 by the direct bonding methods described herein or other methods including flip chip bonding, etc. The first cold plate 1402 may comprise one or more coolant channels as described herein.

In some embodiments, additional semiconductors are not bonded to cold plates. In some embodiments, a second semiconductor device 1406 and/or a third semiconductor device 1408 is air-cooled. For example, one or more aluminum or copper heat sinks may be attached to the second semiconductor device 1406 and/or the third semiconductor device 1408.

Figure 15:
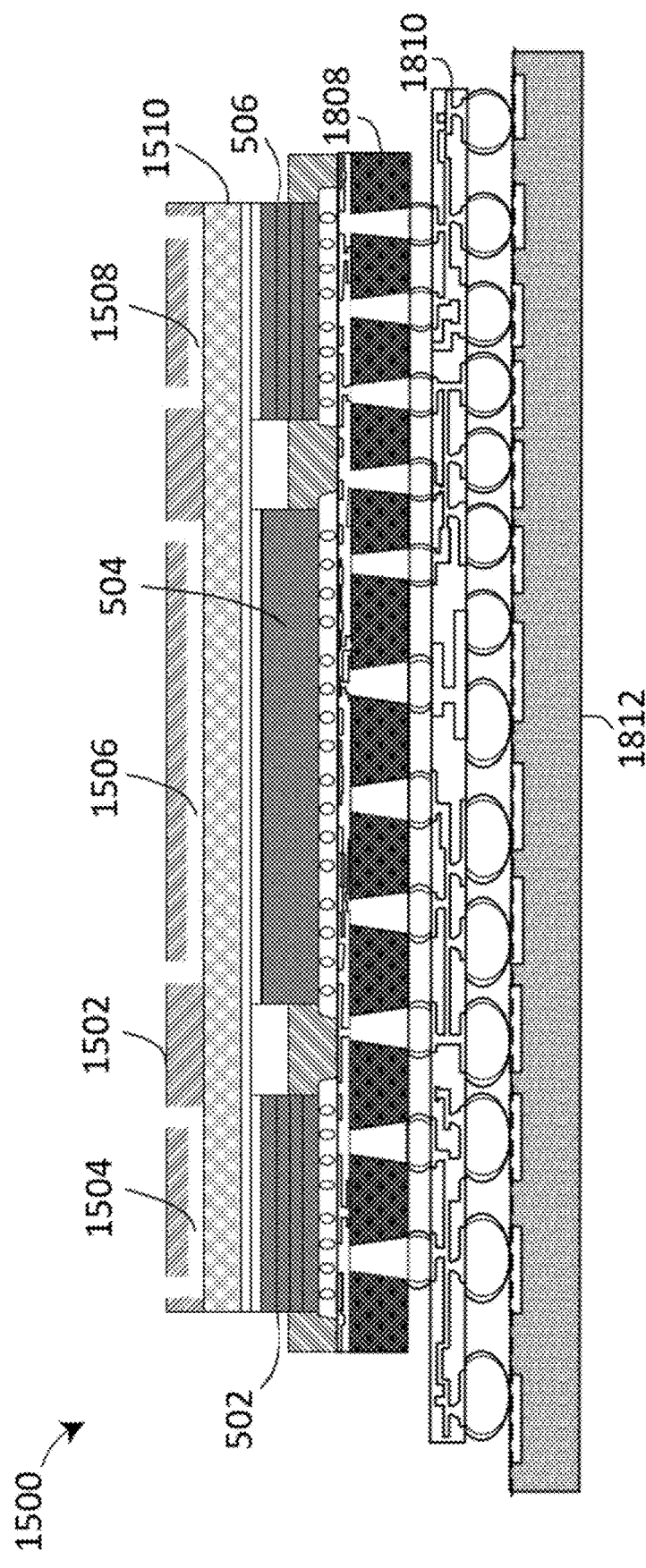
FIG. 15 is a schematic sectional view of an additional integrated cooling assembly design, in accordance with embodiments of the present disclosure.

FIG. 15 is a schematic sectional view of an additional integrated cooling assembly design, in accordance with embodiments of the present disclosure. In some embodiments, the integrated cooling assembly 1500 comprises a single cold plate with a base plate bonded to multiple semiconductor devices. For example, a first cold plate 1502 attached to a base plate 1510 may be bonded to the first semiconductor device 502, the second semiconductor device 504, and the third semiconductor device 506. The base plate 1510 may be attached to each of the semiconductor devices by the direct bonding methods described herein or other methods including flip chip bonding, etc. The first cold plate 1502 may comprise one or more coolant channels as described herein. For example, the first cold plate 1502 may comprise a first coolant channel 1504, a second coolant channel 1506, and a third coolant channel 1508. In some embodiments, the base plate 1510 comprises silicon. In some embodiments, the base plate 1510 provides a barrier between coolant flowing through one or more channels (e.g., second coolant channel 1506) and the backsides of one or more semiconductor devices (e.g., second semiconductor device 504).

Figure 16:
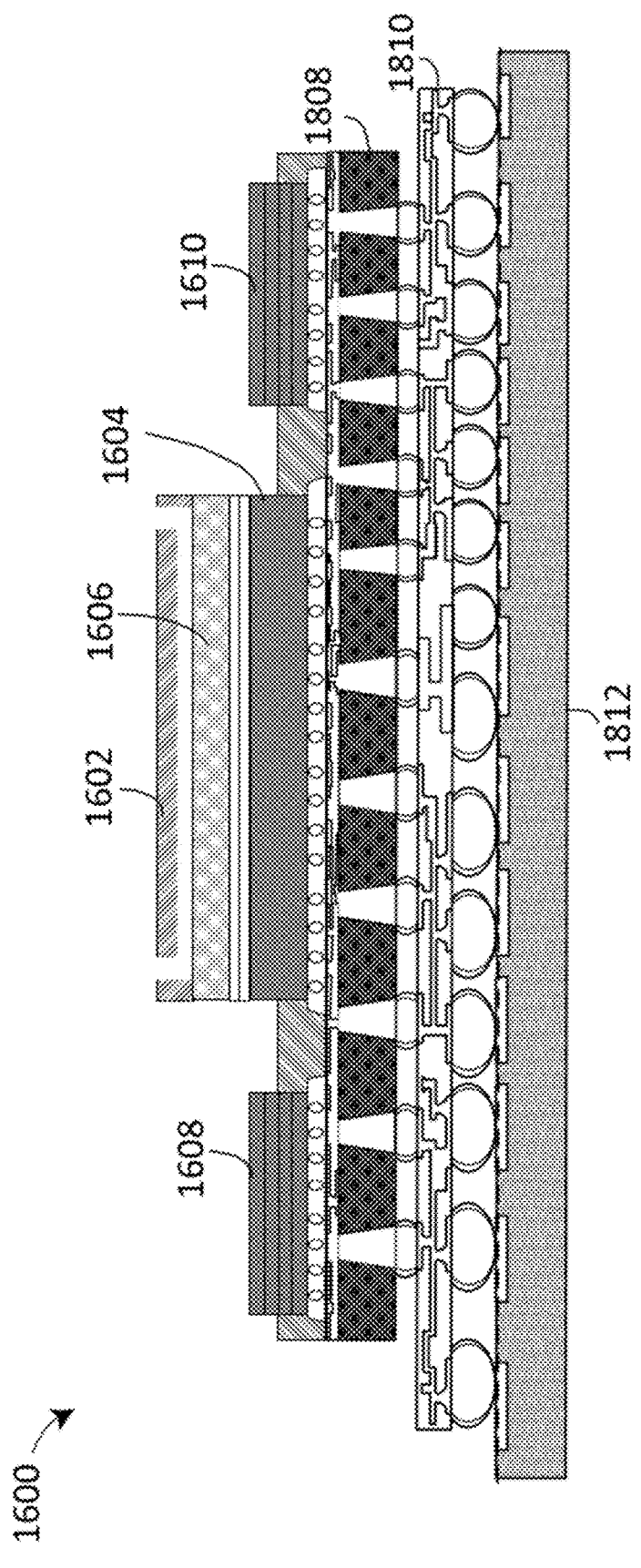
FIG. 16 is a schematic sectional view of an additional integrated cooling assembly design, in accordance with embodiments of the present disclosure.

FIG. 16 is a schematic sectional view of an additional integrated cooling assembly design, in accordance with embodiments of the present disclosure. In some embodiments, the integrated cooling assembly 1600 comprises a single cold plate with a base plate bonded to a single semiconductor device of the plurality of semiconductor devices. For example, a first cold plate 1602 attached to a base plate 1606 may be bonded to a first semiconductor device 1604. The first cold plate 1602 and the base plate 1606 may be bonded to the first semiconductor device 1604 by the direct bonding methods described herein or other methods including flip chip bonding, etc. The first cold plate 1602 may comprise one or more coolant channels as described herein. Although a single cold plate and base plate are shown, more than one base plate and/or cold plate may be used. For example, the first cold plate 1602 and the base plate 1606 may be bonded to a first semiconductor device 1604 and a second cold plate (not shown) and a second base plate (not shown) may be bonded to the second semiconductor device 1608.

In some embodiments, additional semiconductors are not bonded to cold plates. In some embodiments, the second semiconductor device 1608 and/or a third semiconductor device 1610 are air-cooled. For example, one or more aluminum or copper heat sinks may be attached to the second semiconductor device 1608 and/or the third semiconductor device 1610.

Figure 17:
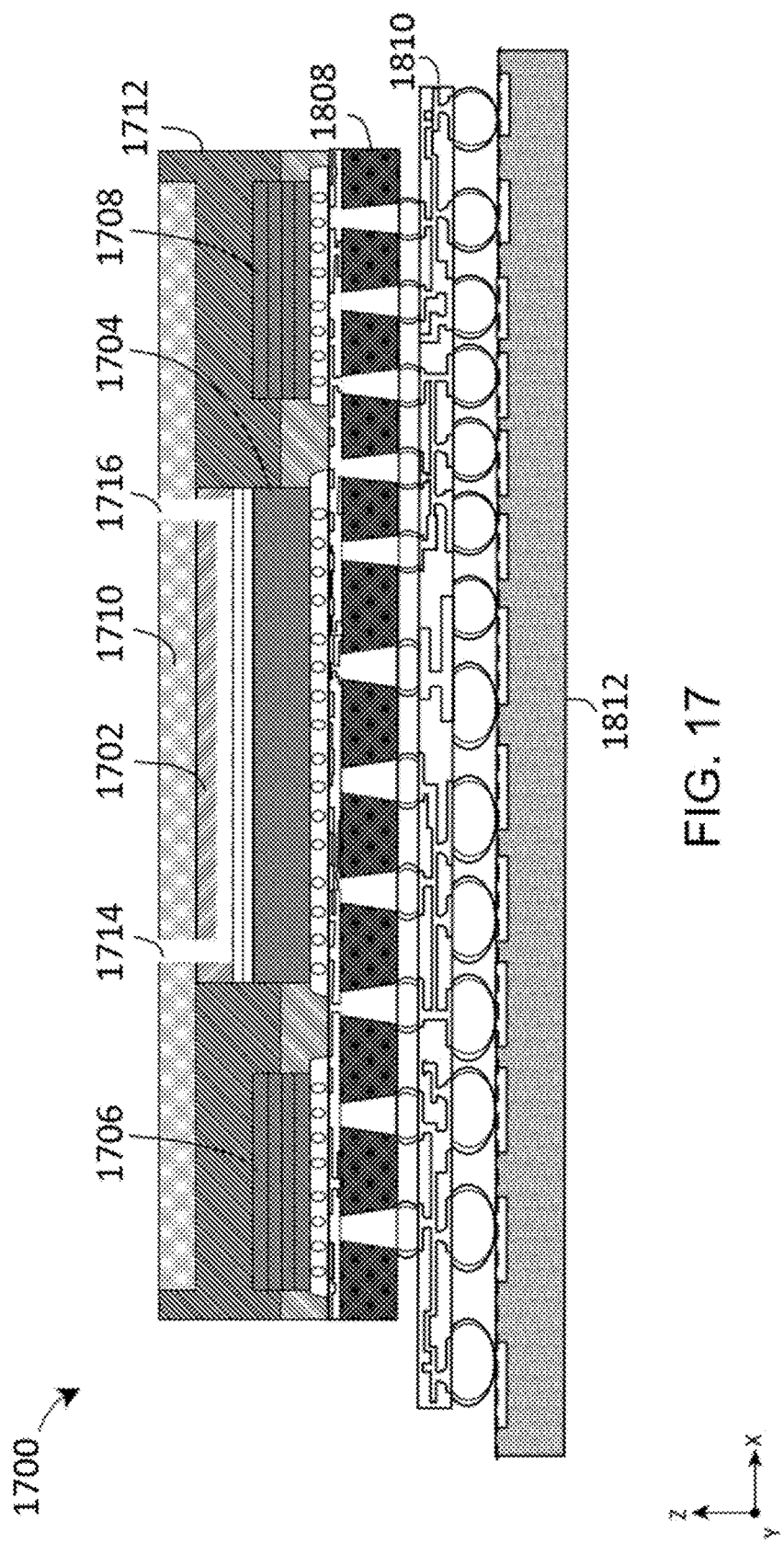
FIG. 17 is a schematic sectional view of an additional integrated cooling assembly design, in accordance with embodiments of the present disclosure.

FIG. 17 is a schematic sectional view of an additional integrated cooling assembly design, in accordance with embodiments of the present disclosure. In some embodiments, the integrated cooling assembly 1700 comprises a cold plate bonded to a single semiconductor device of the plurality of semiconductor devices. For example, a first cold plate 1702 may be bonded to the first semiconductor device 1704. The first cold plate 1702 may be attached to the first semiconductor device 1704 by the direct bonding methods described herein or other methods including flip chip bonding, etc. The first cold plate 1702 may comprise one or more coolant channels as described herein.

In some embodiments, the first cold plate 1702 is attached to a base plate 1710. The first cold plate 1702 may be attached to the base plate 1710 using an adhesive and/or by the direct bonding methods described herein. In some embodiments, the base plate 1710 comprises one or more openings that allow coolant to flow from one or more coolant lines to one or more coolant channels in the first cold plate 1702. The one or more openings may also allow coolant to flow from the one or more coolant channels in the first cold plate 1702 to the one or more coolant lines. For example, coolant may flow from a first coolant line, through a first opening 1714 in the base plate 1710 into a first coolant channel in the first cold plate 1702. The coolant may then absorb heat generated by the first semiconductor device 1704. The coolant may then flow from the first coolant channel in the first cold plate 1702 through a second opening 1716 in the base plate 1702 and into a second coolant line.

In some embodiments, additional semiconductors are not bonded to cold plates. In some embodiments, a second semiconductor device 1706 and/or a third semiconductor device 1708 may be cooled using a TIM 1712 and the base plate 1710. For example, the TIM 1712 may be disposed between the base plate 1710 and the second semiconductor device 1706. Heat generated by the second semiconductor device 1706 may be transferred through the TIM 1712 into the base plate 1710, where coolant flowing through the base plate absorbs the heat.

Figure 18:
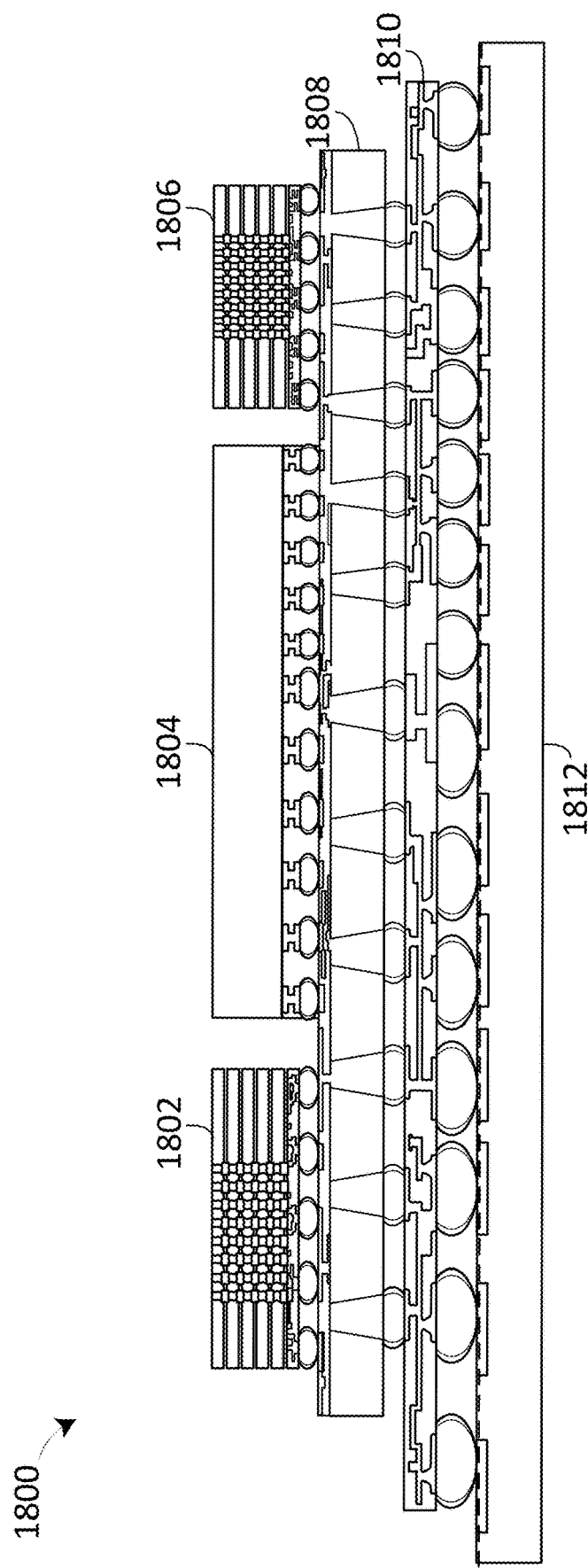
FIG. 18 is a schematic sectional view of a TPU, in accordance with embodiments of the present disclosure.

FIG. 18 is a schematic sectional view of a TPU 1800, in accordance with embodiments of the present disclosure. In some embodiments, one or more integrated cooling assemblies described herein are attached to the TPU 1800. The TPU 1800 may comprise a first semiconductor device 1802, a second semiconductor device 1804, and a third semiconductor device 1806. The first semiconductor device 1802, the second semiconductor device 1804, and the third semiconductor device 1806 may be attached to an interposer layer 1808 and/or a substrate 1810 using any of the methodologies described herein. In some embodiments, the interposer layer 1808 is a silicon interposer or a glass interposer. In some embodiments, the substrate 1810 is attached to a PCB board 1812.

Figure 19:
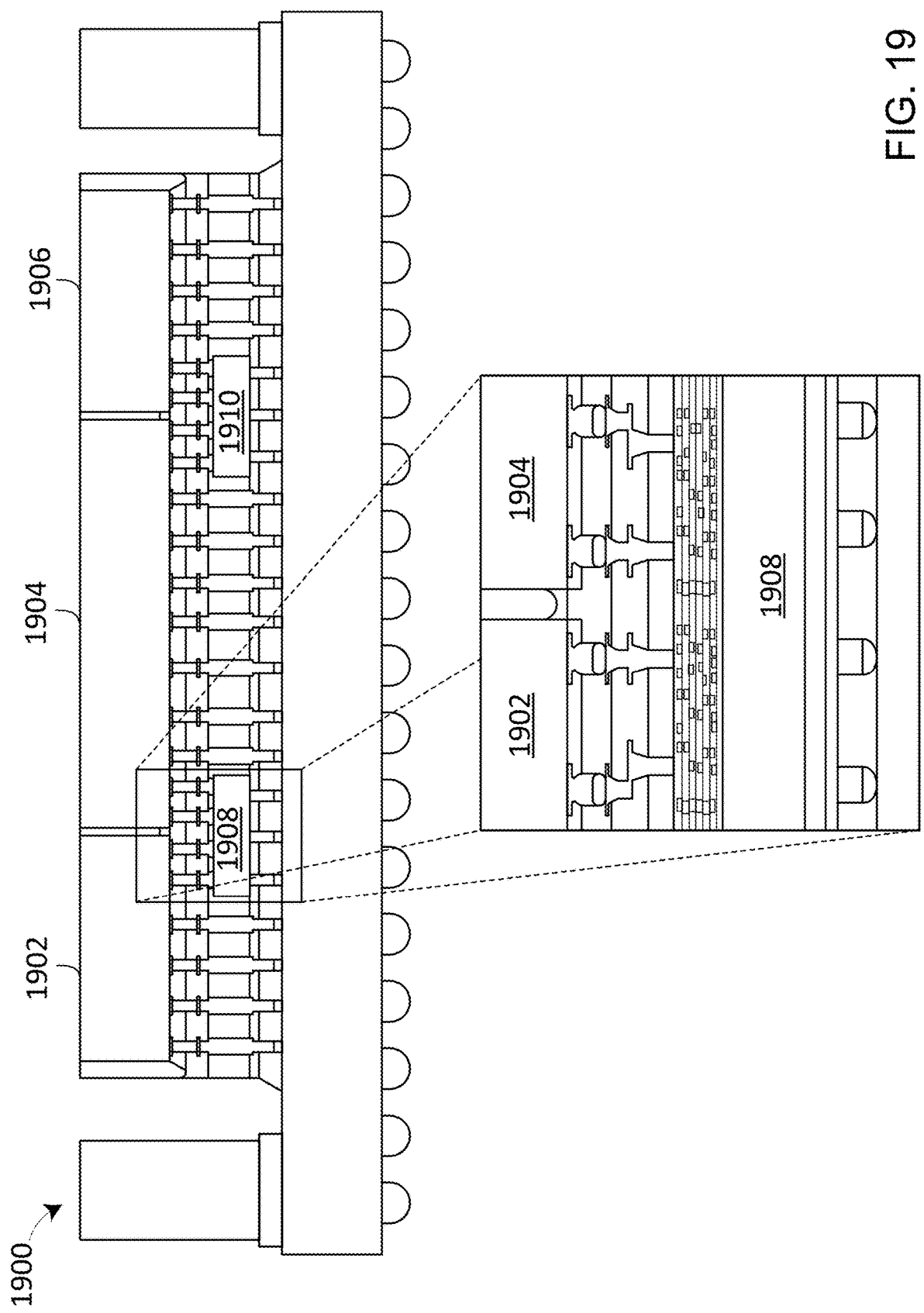
FIG. 19 is a schematic sectional view of another TPU, in accordance with embodiments of the present disclosure.

FIG. 19 is a schematic sectional view of another TPU 1900, in accordance with embodiments of the present disclosure. In some embodiments, one or more integrated cooling assemblies described herein are attached to the TPU 1900. The TPU 1900 may comprise a first semiconductor device 1902, a second semiconductor device 1904, and a third semiconductor device 1906. The TPU 1900 may comprise a first bridge die 1908 and a second bridge die 1910. In some embodiments, the first bridge die 1908 and/or the second bridge die 1910 comprise silicon.

Figure 20:
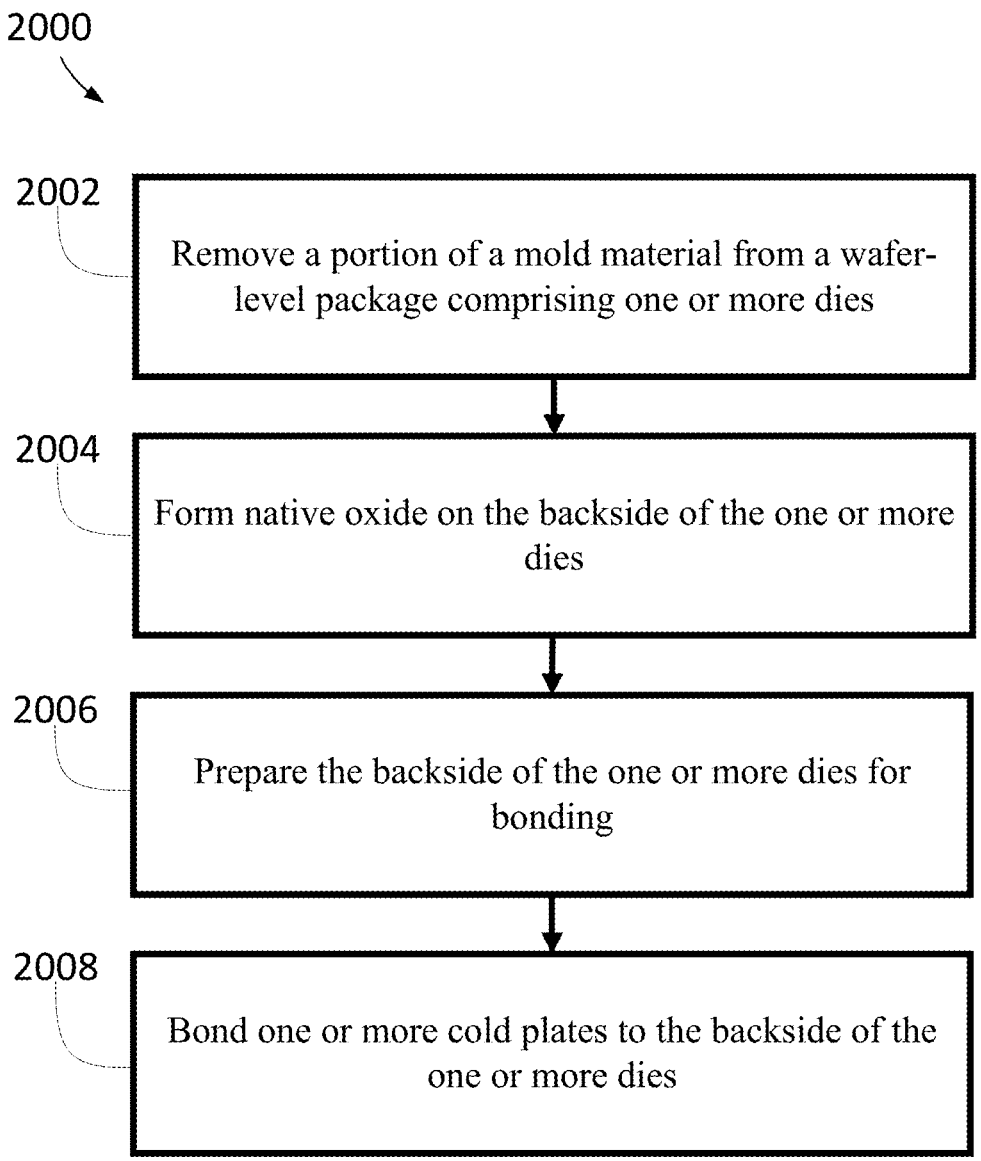
FIG. 20 shows a method that can be used to manufacture the multi-component device package described herein.

FIG. 20 shows a method 2000 that can be used to manufacture the multi-component device package described herein. At block 2002, the method 2000 includes removing a portion of a mold material from a wafer-level package comprising one or more dies. The mold material may be removed using any of the methodologies described herein. In some embodiments, the mold material is removed below one or more surfaces of one or more semiconductor devices as shown in FIG. 6. In some embodiments, at block 2002, the method 2000 includes removing a portion of a mold material from a packaged module (e.g., TPU 1800) comprising one or more dies. The mold material may be removed using any of the methodologies described herein. In some embodiments, the mold material is removed below one or more surfaces of one or more semiconductor devices.

At block 2004, the method 2000 includes forming a native oxide on the backside of the one or more dies. The native oxide may be formed using any of the methodologies described herein. In some embodiments, the native oxide is formed on one or more exposed surfaces of one or more semiconductor devices as shown in FIG. 7.

At block 2006, the method 2000 includes preparing the backside of the one or more dies for bonding. At block 2008, the method 2000 includes bonding one or more cold plates to the backside of the one or more dies. The backside of the one or more dies may be prepared and/or the cold plates may be bonded to the backside of one or more dies using any of the methodologies described herein. The one or more cold plates may be bonded to the backside of the one or more dies as shown in FIG. 13. In some embodiments, the one or more cold plates are attached to a base plate. The one or more cold plates and the base plates may be bonded to the backside of the one or more dies as shown in FIG. 8.

In some embodiments, the method 2000 includes removing a carrier wafer after bonding one or more cold plates to the backside of the one or more dies. In some embodiments, the carrier wafer is removed as shown in FIG. 9. In some embodiments, the method 2000 is used to process a packaged module (e.g., TPU 1800) and no carrier wafer is used. In such embodiments, no carrier wafer is removed.

Figure 21:
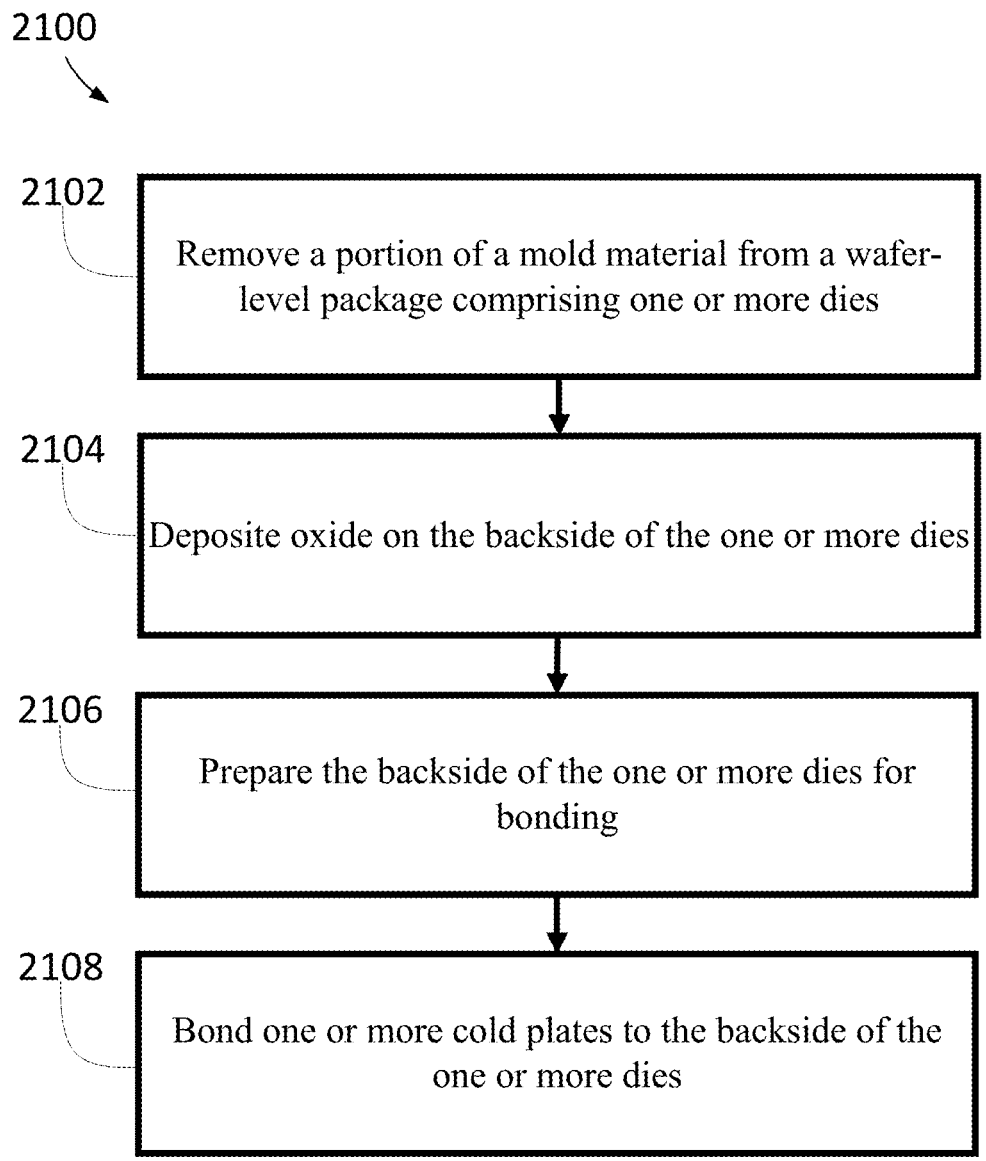
FIG. 21 shows another method that can be used to manufacture the multi-component device package described herein.

FIG. 21 shows a method 2100 that can be used to manufacture the multi-component device package described herein. At block 2102, the method 2100 includes removing a portion of a mold material from a wafer-level package comprising one or more dies. In some embodiments, block 2102 uses the same or similar methodologies described at block 2002 described above. In some embodiments, at block 2102, the method 2000 includes removing a portion of a mold material from a packaged module (e.g., TPU 1800) comprising one or more dies. The mold material may be removed using any of the methodologies described herein. In some embodiments, the mold material is removed below one or more surfaces of one or more semiconductor devices.

At block 2104, the method 2100 includes depositing an oxide on the backside of the one or more dies. The oxide may be deposited on the backside of the one or more dies using any of the methodologies described herein. In some embodiments, the oxide is deposited on one or more exposed surfaces of one or more semiconductor devices as shown in FIG. 10.

At block 2106, the method 2100 includes preparing the backside of the one or more dies for bonding. At block 2108, the method 2100 includes bonding one or more cold plates to the backside of the one or more dies. The backside of the one or more dies may be prepared and/or the cold plates may be bonded to the backside of one or more dies using any of the methodologies described herein. In some embodiments, the one or more cold plates are attached to a base plate. The one or more cold plates and the base plates may be bonded to the backside of the one or more dies as shown in FIG. 11. In some embodiments, the one or more cold plates are not attached to a baseplate. The one or more cold plates may be bonded to the backside of the one or more dies without a cold plate as shown in FIG. 13.

In some embodiments, the method 2100 includes removing a carrier wafer after bonding one or more cold plates to the backside of the one or more dies. In some embodiments, the carrier wafer is removed as shown in FIG. 12. In some embodiments, the method 2100 is used to process a packaged module (e.g., TPU 1800) and no carrier wafer is used. In such embodiments, no carrier wafer is removed.

The embodiments discussed above are intended to be illustrative and not limiting. One skilled in the art would appreciate that individual aspects of the cooling assemblies, device packages, and methods discussed herein may be omitted, modified, combined, and/or rearranged without departing from the scope of the disclosure.

What is claimed is:

1. A method comprising:
preparing a plurality of semiconductor devices, wherein the plurality of semiconductor devices are encapsulated in a mold material;
removing a portion of the mold material to expose a backside of a first semiconductor device of the plurality of semiconductor devices;
forming a first dielectric layer on the backside of the first semiconductor device;
preparing a first cold plate attached to a first portion of a base plate, wherein the first cold plate comprises a coolant channel; and
directly bonding the base plate to the first dielectric layer on the backside of the first semiconductor device.

2. The method of claim 1, wherein the first semiconductor device is at least one of a CPU, GPU, DPU, TPU, or IPU.

3. The method of claim 1, wherein the base plate is directly bonded to the first semiconductor device using direct dielectric bonds.

4. The method of claim 3, wherein the first dielectric layer is formed using a wet chemical treatment.

5. The method of claim 4, wherein the first dielectric layer is formed using at least one of a piranha etch, an oxygen ($O_2$) activation process, a nitrogen ($N_2$) activation process, or a hydrogen peroxide ($H_2O_2$) treatment.

6. The method of claim 3, wherein forming the first dielectric layer comprises depositing the first dielectric layer.

7. The method of claim 3, further comprising polishing the backsides of the first semiconductor device before directly bonding.

8. The method of claim 3, further comprising releasing a carrier wafer from the first semiconductor device subsequent to the direct bonding.

9. The method of claim 1, wherein the base plate is directly bonded to the first semiconductor device using direct hybrid bonds.

10. The method of claim 1, wherein the first cold plate comprises more than one coolant channel.

11. The method of claim 3, further comprising:
exposing a backside of a second semiconductor device of the plurality of semiconductor devices;
forming a second dielectric layer on the backside of the second semiconductor device; and
directly bonding a second cold plate to the second dielectric layer on the backside of the second semiconductor device, wherein the second cold plate comprises a second coolant channel.

12. The method of claim 3, further comprising:
exposing a backside of a second semiconductor device of the plurality of semiconductor devices; and
forming a second dielectric layer on the backside of the second semiconductor device, wherein the base plate is directly bonded to the second dielectric layer on the backside of the second semiconductor device.

13. The method of claim 12, further comprising preparing a second cold plate attached to a second portion of the base plate, wherein the second cold plate comprises a second coolant channel.

14. The method of claim 13, wherein:
the first portion of the base plate is between the first cold plate and the backside of the first semiconductor device, and
the second portion of the base plate is between the second cold plate and the backside of the second semiconductor device.

15. The method of claim 14, wherein the second semiconductor device is a memory chip.

16. A method comprising:
preparing a plurality of semiconductor devices, wherein the plurality of semiconductor devices are encapsulated in a mold material;
removing a portion of the mold material to expose a backside of a first semiconductor device of the plurality of semiconductor devices;
forming a first dielectric layer on the backside of the first semiconductor device;
preparing a first cold plate attached to a first portion of a base plate, wherein the first cold plate comprises a coolant channel; and
directly bonding the first cold plate to the first dielectric layer on the backside of the first semiconductor device.

17. The method of claim 16, wherein the first cold plate is directly bonded to the first semiconductor device using direct dielectric bonds.

18. The method of claim 16, wherein the first cold plate is directly bonded to the first semiconductor device using direct hybrid bonds.

19. The method of claim 16, wherein the first cold plate comprises more than one coolant channel.

* * * * *